(12) United States Patent
Kinsinger et al.

(10) Patent No.: US 12,395,181 B1
(45) Date of Patent: Aug. 19, 2025

(54) METHODS AND SYSTEMS FOR CALIBRATING A TIME-INTERLEAVED ANALOG TO DIGITAL CONVERTER (TIADC)

(71) Applicant: Alphacore, Inc., Tempe, AZ (US)

(72) Inventors: Matthew Maurice Kinsinger, Phoenix, AZ (US); Phaneendra Bikkina, Tempe, AZ (US)

(73) Assignee: Alphacore, Inc., Tempe, AZ (US)

( * ) Notice: Subject to any disclaimer, the term of this patent is extended or adjusted under 35 U.S.C. 154(b) by 0 days.

(21) Appl. No.: 19/195,291

(22) Filed: Apr. 30, 2025

(51) Int. Cl.
  *H03M 1/10* (2006.01)
  *H03M 1/06* (2006.01)
  *H03M 1/12* (2006.01)

(52) U.S. Cl.
  CPC ....... *H03M 1/1023* (2013.01); *H03M 1/0607* (2013.01); *H03M 1/121* (2013.01)

(58) Field of Classification Search
  CPC ... H03M 1/1023; H03M 1/0607; H03M 1/121
  USPC ......................................... 341/118, 120, 155
  See application file for complete search history.

(56) References Cited

U.S. PATENT DOCUMENTS

| | | | |
|---|---|---|---|
| 9,401,726 B2 * | 7/2016 | Ragab | H03M 1/121 |
| 11,323,128 B2 * | 5/2022 | Sjöland | H03M 1/1023 |

OTHER PUBLICATIONS

Duc, Han Le et al., "A Fully Digital Background Calibration of Timing Skew in Undersampling TI-ADC", 2014 IEEE 12th International New Circuits and Systems Conference (NEWCAS); Jun. 22-25, 2014; https://ieeexplore.ieee.org/document/6933983; 4 pages.

Liu, Cheng et al., "Calibration on timing skew mismatch of time-interleaved ADC based on optimized adaptive genetic algorithm backpropagation neural network", International Journal of Circuit Theory and Applications; Aug. 18, 2024; https://doi.org/10.1002/cta.4252; 16 pages.

Lu, Zhifei et al., "A New Artificial Neural Network-Based Calibration Mechanism for ADCs: A Time-Interleaved ADC Case Study", IEEE Transactions on Very Large Scale Integration (VLSI) Systems; vol. 32, Issue 7; Jul. 2024; https://ieeexplore.ieee.org/document/10517940; 11 pages.

Qiu, Yongtao et al., "A Novel Calibration Method of Gain and Time-skew Mismatches for Time-interleaved ADCs Based on Neural Network", 2019 IEEE Mtt-S International Wireless Symposium (IWS); May 19-22, 2019; https://ieeexplore.ieee.org/document/8804030; 3 pages.

Zhai, Danfeng et al., "High-Speed and Time-Interleaved ADCs Using Additive-Neural-Network-Based Calibration for Nonlinear Amplitude and Phase Distortion", IEEE Transactions on Circuits and Systems I: Regular Papers; vol. 69, Issue 12; Dec. 2022; https://ieeexplore.ieee.org/document/9870655; 14 pages.

* cited by examiner

*Primary Examiner* — Khai M Nguyen
(74) *Attorney, Agent, or Firm* — LOZA & LOZA, LLP

(57) ABSTRACT

Methods and systems and method for calibrating a time-interleaved Analog to Digital Converter (TIADC) are disclosed. In an example, a method for calibrating a TIADC involves a first calibration phase that involves adjusting for at least one of offset error, gain error, and time skew of M subchannels of the TIADC, and a second calibration phase that is implemented after the first calibration phase and that involves training a neural network to approximate a non-linear function of each of the M subchannels of the TIADC using an output from a reference channel as a ground truth.

20 Claims, 22 Drawing Sheets

200

First Phase Calibration

Adjust for at least one of offset error, gain error, and time skew of M subchannels of the TIADC 1) CDAC capacitor mismatch
    2) Analog front end bandwidth gain and phase mismatch
    3) Offset mismatch
    4) Gain mismatch
    5) Time-skew mismatch

~202

Second Phase Calibration

Train a neural network to approximate a non-linear function of each of the M subchannels of the TIADC using an output from a reference channel as a ground truth -Training of subchannel-level neural networks
    -Training of sub-ADC-level neural networks

METHODS AND SYSTEMS FOR CALIBRATING A TIME-INTERLEAVED ANALOG TO DIGITAL CONVERTER (TIADC)

BACKGROUND

A time-interleaved ADC (TIADC) includes multiple sub-ADCs that sample an analog signal and convert the analog signal to a series of digital values. Each of the sub-ADCs sample at the same rate, but if the sample times are uniformly spaced, and each sub-ADC digitizes the analog signal with identical accuracy, then the overall system acts as a single ADC sampling at a rate of all the sub-ADCs combined. That is, a TIADC with M sub-ADCs, each sampling at a rate fs, will have a sample rate of M*fs. In practice, the M sub-ADCs have mismatches in the precision at which the analog signal is digitized and the sampling times of the M sub-ADCs are not uniformly spaced. The causes of such mismatches include deviations in the physical mechanisms by which each sub-ADC digitizes the analog signal. Each sub-ADC can be considered as a unique system that can be represented physically by a complicated, but deterministic, input to output function. Thus, for each sub-ADC, the input analog signal passes through a system that has an unknown, but deterministic input-output function, and between the sub-ADCs there are many mismatches between the input-output functions. Some examples of sources of mismatch are the timing of the sampling switches, the RC time constants seen by the input analog signal when entering each sub-ADC, and the gain or offset inherent to each sub-ADC in the conversion of the analog signal to a digital number. The mismatches can cause deviations in both the gain and phase-shift of the input signal during the sampling and digitization process of each sub-ADC, which causes the output data to deviate from one sub-ADC to another. The output data may be distorted because the input signal was sampled by N different subchannels, rather than appearing to have been sampled by a single system, as would be the case if all sub-ADCs were perfectly matched.

SUMMARY

Methods and systems and method for calibrating a time-interleaved Analog to Digital Converter (TIADC) are disclosed. In an example, a method for calibrating a TIADC involves a first calibration phase that involves adjusting for at least one of offset error, gain error, and time skew of M subchannels of the TIADC, and a second calibration phase that is implemented after the first calibration phase and that involves training a neural network to approximate a non-linear function of each of the M subchannels of the TIADC using an output from a reference channel as a ground truth.

In an example, the first calibration phase includes adjusting for at least one of component mismatch, analog front end bandwidth gain and phase mismatch, offset mismatch, gain mismatch, and time-skew mismatch.

In an example, the first calibration phase includes adjusting for at least one of component mismatch, analog front end bandwidth gain and phase mismatch, offset mismatch, gain mismatch, and time-skew mismatch in a priority order from a first calibration operation to a last calibration operation of 1) component mismatch, 2) analog front end bandwidth gain and phase mismatch, 3) offset mismatch, 4) gain mismatch, and 5) time-skew mismatch.

In an example, adjusting for component mismatch involves calculating weights for a weight vector that includes one weight for each of the M subchannels, wherein the weight vector accounts for capacitor mismatch between the M subchannels.

In an example, adjusting for time-skew mismatch involves capturing data from at least three subchannels at the TIADC sampling rate and determining timing offset in digital logic at a Y clock cycles, where Y is large relative to the TIADC sampling rate.

In an example, the TIADC includes subchannel-level neural networks, and wherein the second calibration phase includes training each subchannel-level neural network individually.

In an example, the TIADC includes M neural networks.

In an example, the TIADC includes subchannel-level neural networks, and the second calibration phase includes providing the ground truth to each one of the subchannel-level neural networks and training each one of the subchannel-level neural networks individually using the ground truth.

In an example, the TIADC includes N sub-ADCs per subchannel and M×N neural networks.

In an example, the TIADC includes sub-ADC-level neural networks, and the second calibration phase includes providing the ground truth to each one of the sub-ADC-level neural networks and training each one of the sub-ADC-level neural networks individually using the ground truth.

In an example, the TIADC includes N sub-ADCs per subchannel and M×N neural networks.

In an example, the TIADC includes M neural networks.

In an example, the TIADC includes N sub-ADCs per subchannel and M×N neural networks.

In an example, the reference channel operates at a lower sampling frequency than the M subchannels.

Another example of a method for operating a TIADC includes a first calibration phase that involves adjusting for at least one of offset error, gain error, and time skew of M subchannels of the TIADC, wherein the first calibration phase includes adjusting for at least one of component mismatch, analog front end bandwidth gain and phase mismatch, offset mismatch, gain mismatch, and time-skew mismatch, and a second calibration phase that is implemented after the first calibration phase and that involves training subchannel-specific neural networks to approximate a non-linear function of each of the M subchannels of the TIADC using an output from a reference channel as a ground truth.

In an example, the method further includes outputting a digital signal from the TIADC in response to an analog signal after the first calibration phase and the second calibration phase.

An example of a TIADC is disclosed. The TIADC includes M subchannels, each of the M subchannels including N sub-ADCs, a reference channel that includes an ADC, and subchannel-specific neural networks, wherein the subchannel-specific neural networks are coupled to the reference channel to receive outputs from the reference channel that are used as ground truths to train the subchannel-specific neural networks.

In an example, the TIADC includes M neural networks.

In an example, the TIADC includes N sub-ADCs per subchannel and M×N neural networks.

In an example, a capacitor of the reference channel is larger than capacitors of the M subchannels.

Other aspects in accordance with the invention will become apparent from the following detailed description,

BRIEF DESCRIPTION OF THE DRAWINGS

FIG. 2 is a flow diagram that illustrates an example of a two phase calibration process as disclosed herein.

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1A:
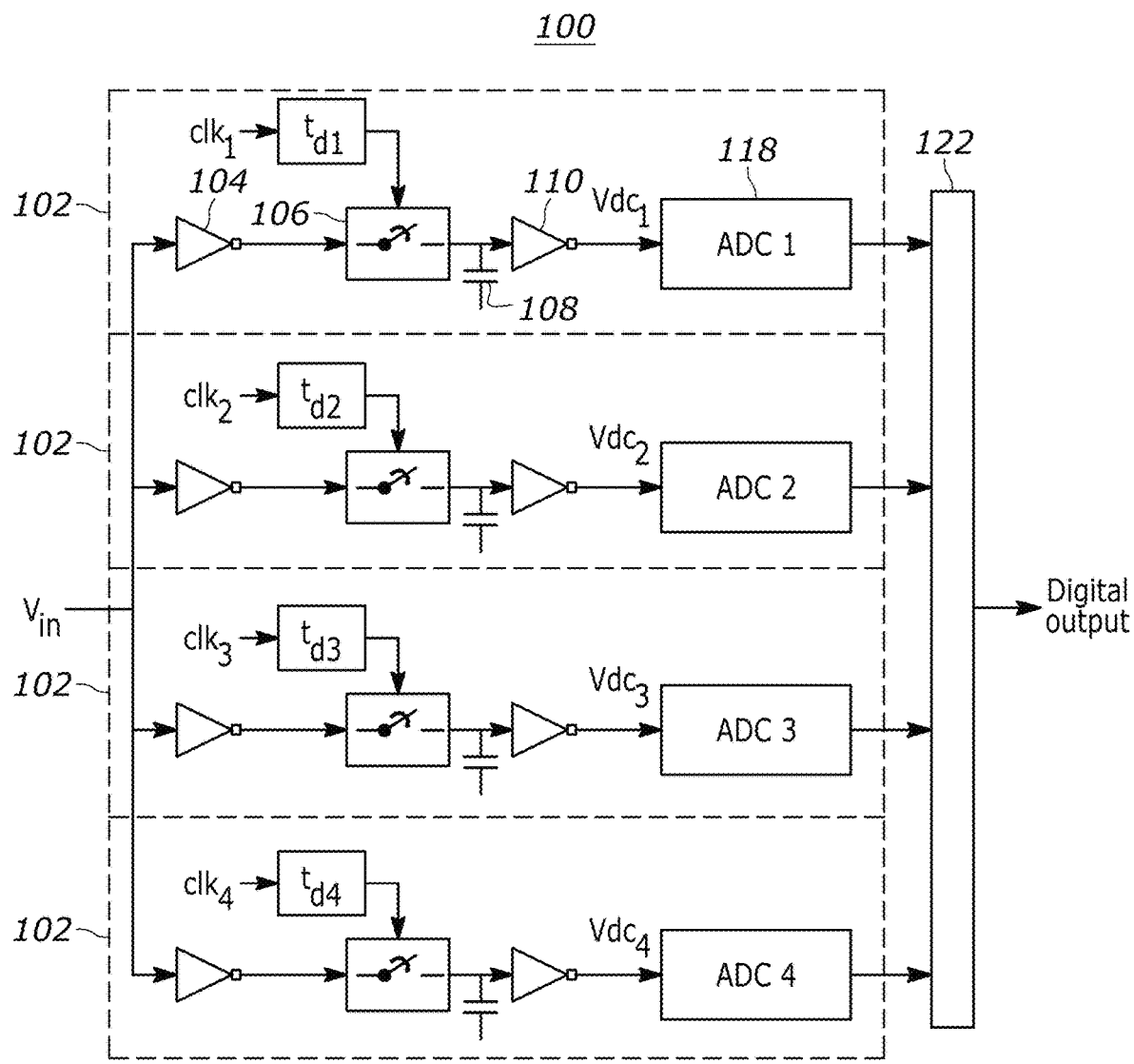
FIG. 1A is an example of a TIADC that includes four subchannels.
Figure 1B:
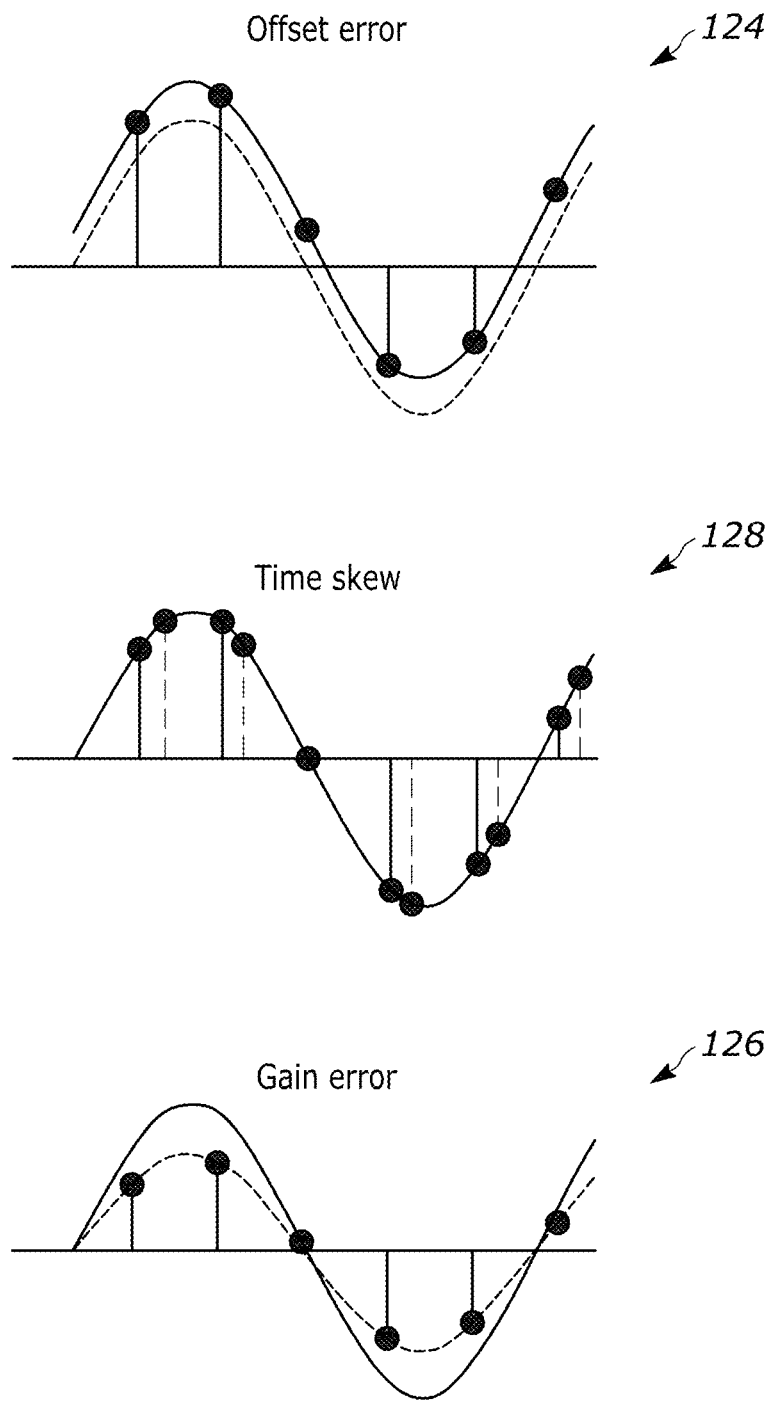
FIG. 1B illustrates examples of offset error, gain error, and time skew in the context of the TIADC of FIG. 1B.

FIG. 1A is an example of a TIADC 100 that includes four subchannels 102, subchannels 1-4. Each subchannel of the TIADC includes a first amplifier 104, a sampling switch 106, a capacitor 108, a second amplifier 110, and an ADC 118, referred to herein as a sub-ADC. In operation, the switches are turned on sequentially to sample an incoming analog signal, Vin. As described above, the sampling rate of the TIADC is N times the sampling frequency, fs, which in the example of FIG. 1A is four times the sampling frequency (4×fs). The outputs from the sub-ADCs are combined in digital combining logic 122 to form a digital output, which is a digital representation of the analog input signal, Vin. In the TIADC of FIG. 1A, there may be mismatches between the data that is output from the sub-ADCs. As is known in the field, the mismatches are often characterized in terms of offset error, gain error, and time skew. FIG. 1B illustrates examples of offset error 124, gain error 126, and time skew 128 in the context of the TIADC of FIG. 1B. With reference to FIG. 1B, offset error refers to a DC voltage difference between the outputs of two different ADCs, gain error refers to a difference in amplification between different ADCs, e.g., meaning that the outputs from the subchannels may not be perfectly scaled versions of the input signals, and time skew refers to a difference in sampling times between subchannels. As used herein, the terms error and mismatch may be used interchangeably to refer to differences in outputs between subchannels and/or a reference channel.

The sources of mismatches between the outputs of the sub-ADCs of a TIADC are numerous. The sources of the mismatches can be classified in many ways. For example, the mismatches can be classified into two groups; input frequency dependent (dynamic mismatch) and input frequency independent (static mismatch). Some examples of dynamic mismatches are the gain and phase mismatches due to the RC time constants of the subchannels which are a function of the transfer function of the input sampling network. For example, the clock phase of a sampling switch creates a deviation from uniform sampling in the time domain, which is mapped to a deviation in voltage from the ideal uniform sampling time. The mapping from sample time-skew to voltage deviation is a function of the input signal frequency. An example of a static mismatch is the offset, or average value, of the digital outputs of the sub-ADCs. However, a simple static/dynamic classification may not be sufficient to account for all the sources of mismatch in a TIADC. For example, the RC values of the input sampling network are functions of the transistors that make up the physical circuit. The input sampling network has R and C values that can vary based upon the amplitude and the direction of change in the amplitude of the input signal at the time of sampling (increasing, decreasing, or constant) because the amplitude and direction of change of the amplitude modulates the ON-resistance and parasitic capacitances of the sampling switches. In general, physical mismatches between the sub-ADCs can be classified by what type of mathematical model is required to accurately represent the physical mismatches, with the goal of inverting the mathematical representation to remove the effect that the mismatch has on the sampled data. If all of the physical mismatches between the sub-ADCs could be precisely modeled, and the inverse function for the model determined, then all sources of mismatch could be calibrated out of a TIADC to achieve the ideal of perfectly matched subchannel transfer functions and perfectly uniform sampling of the input signal.

Some mismatches between subchannels of a TIADC, such as static (input frequency independent) offset, can be removed by averaging the output data for each sub-ADC, and then subtracting the average. However, there are offsets that are dynamic (input frequency dependent), and it is difficult to precisely model and remove such mismatch. For mismatches that are difficult to model and remove, a technique of randomization can be used to vary the effect of some physical deterministic mismatch. Examples are randomization of the sample time skew, or the capacitive and resistive loading seen by the input during sampling. Fixed, deterministic mismatches will create distortions in the output data that show up as signal power at undesired frequencies. The power seen at these undesired frequencies may be detrimental to the performance of the ADC, and reduction of the signal power at the undesired frequencies is an important goal in ADC circuit design. Randomization will cause the mismatches to appear at many different frequencies, rather than a specific fixed frequency. The total distortion power is the same, but the distortion power is spread out over a larger frequency region. Thus, the power in any single undesired frequency, also known as distortion, will reduce, but the overall ratio of power at the desired frequency compared to power at all other undesired frequencies, known as the signal to noise and distortion ratio, SNDR, will be reduced compared to a TIADC with no mismatches between the sub-ADCs.

As an example, consider the mismatches of sample-time skew, and input sampling network RC mismatch. If the exact value of the time-skew and RC mismatch were known, tunable delay cells could be used to adjust the phase of the sampling clock and resistance or capacitance units could be used to adjust the input sampling network to perfectly cancel the time-skew and RC mismatches and eliminate the mismatch spurs without increasing the noise floor. Moreover, a tunable RC would need to be dynamically adjusted depending on the input signal's frequency, amplitude, and direction of change in amplitude. It is reasonable to expect that there exists a function that maps these three input signal characteristics (frequency, amplitude, and direction of change in amplitude) to a dynamic gain and time-skew mismatch between any given sub-ADC of the TIADC and some ideal, perfectly performing, reference sub-ADC. However, the exact function is very difficult to derive in a closed-form expression that can be used to design an analog circuit or digital algorithm to compensate for the mismatch.

In response to the difficulties of modeling the physical phenomena that leads to a given mismatch between sub-ADCs and calculating the inverse action to undo the mismatch, a two-phase calibration process is utilized to approximate the unknown functions. The first calibration phase of the two-phase calibration process involves using conventional calibration processes that may include both digital domain averaging, addition, and multiplication and analog domain delay and RC tuning in discrete steps to adjust for offset, gain, and/or time-skew mismatches. Using conventional calibration processes, the offset and gain of each sub-ADC can be extracted through averaging operations on the digital output data. Auto-correlation based algorithms can also be used to calculate the mismatches in sampling clock timing and input network RC values between sub-ADCs. The first calibration phase is relatively straight forward but has at least two drawbacks. The averaging process may be an overly simplified approximation to the exact mismatch function and the discrete tuning steps may introduce residual errors due to finite tuning precision. Moreover, the mechanisms available for adjusting the delay of the sampling clock are limited by both area and jitter constraints. Increasing the tunable range of the sampling clock without introducing jitter may require capacitive tuning cells and achieving sufficient linearity and tuning range may require large capacitors which take up a large area in the critical clock routing paths of the TIADC. Linearity and a wide tuning range may be achieved by using tunable delay inverter devices, but adding such devices into the clock path may introduce jitter with RMS values on the order of tens of femto-seconds per device. Such jitter may not be tolerable for high-speed ADC applications that typically demand total root-mean-square (RMS) jitter for the entire clock path to be below 50 femto-seconds.

A goal of the first calibration phase is to reduce mismatches (e.g., offset, gain, and time-skew) that have relatively simple physical models to as low of levels as possible using conventional calibration techniques such as digital domain averaging, addition, multiplication, and analog domain tuning of circuit elements. In an example, the analog tuning mechanism may include discrete capacitance and resistance unit loading of the input sampling network. In an example, the discrete capacitance and resistance unit loading is driven by a digital averaging process that enables convergence to optimum R and C values. Thus, the first calibration phase will help to reduce mismatches between sub-ADCs of the TIADC, which will ease the burden on the second calibration phase.

The second calibration phase of the two-phase calibration process involves approximating an unknown, highly nonlinear, but physically deterministic function that represents the input-output characteristic of each subchannel of the TIADC. In an example, the mechanism for approximating and inverting the functions includes machine learning based neural networks. In general, the closer the first calibration phase comes to an actual function, the more accurately the function can be approximated by a linear function. Thus, the first calibration phase enables the size and complexity of the neural network that is needed for the second calibration phase to be reduced. For example, in the first calibration phase, the time-skew mismatches should be reduced to 100 fs or lower, the static offset and gain mismatches should be reduced to below 0.05%, and the RC time constant mismatches should be reduced to 1% or lower.

After the first calibration phase there still exists mismatches in the time-skew, input network RC time constant, and other complicated physical mismatches between the subchannels. The mismatches have some complicated, unknown, but physically deterministic mapping to errors in the TIADC digital output that depend on, among other things, input signal frequency, amplitude, and direction of change in amplitude. To approximate the inverse of the physically deterministic mapping, a neural network is used. The neural network is trained so that the neural network can act on the sub-ADC data and change the sub-ADC data to the data that would have been generated if each subchannel was precisely matched to all of the other subchannels. In an example, a reference channel is included in the TIADC and used to train the neural network. In particular, digital data output from the reference channel is used as a ground truth to train neural networks of the TIADC. The reference channel can operate at a lower sampling rate than the other subchannels and can be designed in a superior manner at the cost of additional area and preferred layout routings on an IC device that cannot be afforded to the subchannels. The digital data output from the reference channel is considered to be accurate (e.g., ground truth data) and the neural network will be trained with the goal of aligning the output of all of the subchannels with the reference channel. Once the neural networks are trained, subchannels of the TIADC may perform as well as the reference channel, and more importantly, the subchannels of the TIADC are matched to each other by way of matching to the reference channel.

In an example, neural networks are configured in a block-level hierarchy in which a fixed group of sub-ADCs is modeled as a single system. Because there are multiple sub-ADCs in each block, the function that the neural network needs to learn and match to the reference channel can be rather complicated, but only one neural network is needed per subchannel. In another example, neural networks are configured in a sub-ADC-level hierarchy in which there is a dedicated neural network for each sub-ADC in a subchannel. Thus, if each subchannel includes N sub-ADCs and N corresponding neural networks, then the total number of neural networks for a TIADC is N×the number of subchannels. For example, a TIADC with M subchannels and N sub-ADCs per subchannel will have 128 sub-ADC-specific neural networks. Using a sub-ADC-level hierarchy of neural networks, the function that each neural network needs to learn may be simpler but more neural networks are needed.

FIG. 2 is a flow diagram 200 that illustrates an example of a two phase calibration process as disclosed herein. The two phase calibration process includes a first calibration phase 202 (phase 1) that involves adjusting for at least one of offset error, gain error, and time skew of the subchannels of the TIADC and a second calibration phase 204 (phase 2) that involves training a neural network to approximate a nonlinear function of each of the subchannels of the TIADC using an output from a reference channel as a ground truth.

In an example, the first phase calibration 202 may involve making adjustments in the digital domain and/or making adjustments in the analog domain and the adjustments may address at least one of static capacitor mismatch, dynamic analog front end bandwidth gain and phase mismatch, static offset mismatch, static gain mismatch, and dynamic time skew mismatch. In an example, the second phase calibration 204 may involve subchannel level training of neural networks or sub-ADC level training of neural networks.

Figure 3A:
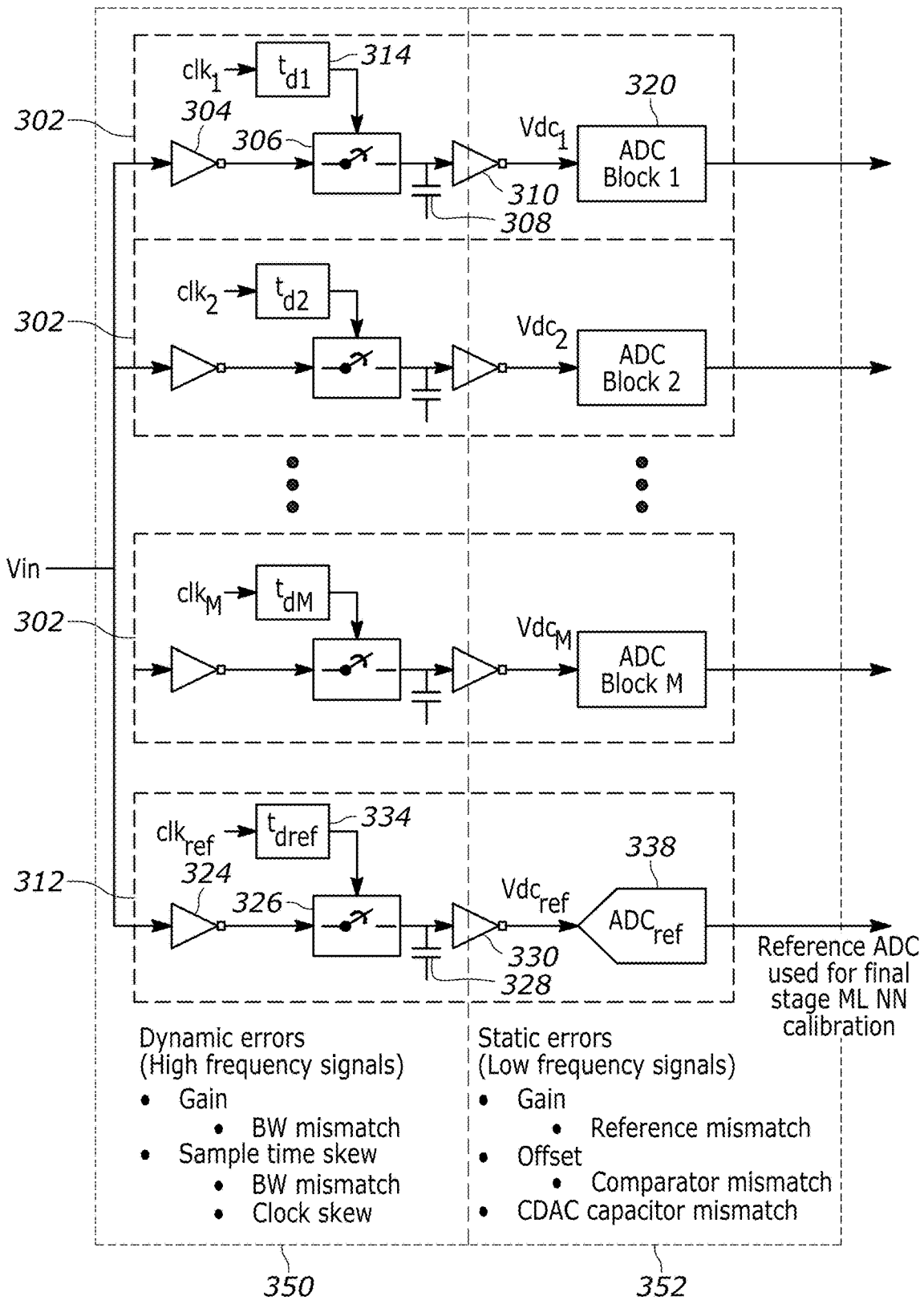
FIG. 3A is an example of a TIADC that is configured to support two phase calibration as disclosed herein.
Figure 3B:
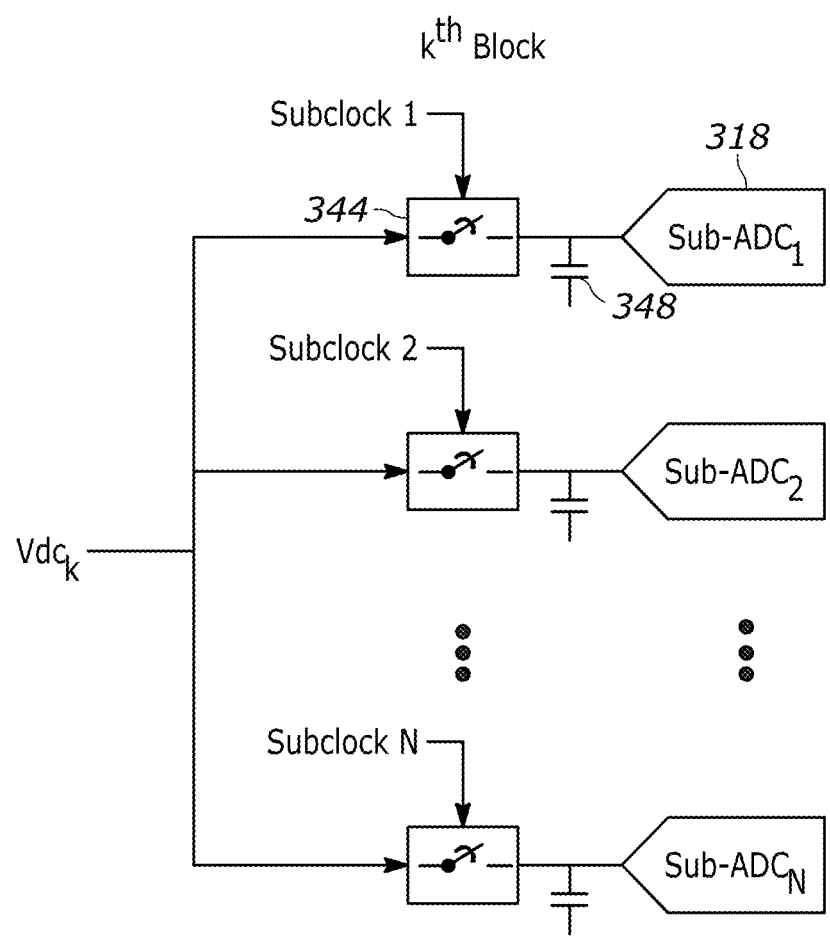
FIG. 3B is an example of one of the ADC blocks from FIG. 3A in which each ADC block includes N sub-ADCs.

FIG. 3A is an example of a TIADC 300 that is configured to support two phase calibration as disclosed herein. The TIADC includes M subchannels 302 and a reference channel 312. Each subchannel includes a first amplifier 304, a delay element 314, a sampling switch 306, a capacitor 308, a second amplifier 310, and an ADC block 320 and the reference channel includes a first amplifier 324, a delay element 334, a sampling switch 326, a capacitor 328, a second amplifier 330, and an ADC 338, referred to herein as the reference-ADC. The ADC block of each subchannel includes multiple parallel sub-ADCs. FIG. 3B is an example of one of the ADC blocks 320 from FIG. 3A, referred to as ADC block "k," in which each ADC block includes N sub-ADCs 318, N corresponding capacitors 348, and N corresponding sampling switches 344 that are controlled by corresponding subclocks, $clk_{k1}$-$clk_{kN}$, where the subclocks are generated from the kth clock. In an example, N is a positive integer and the subclocks are generated from the kth clock. The example TIADC of FIGS. 3A and 3B has a total of M×N sub-ADCs 318 and in one example, M=16 and N=8, such that the total number of sub-ADCs is 128 (12×8=128). In an example, the sampling frequency, fs, is 500 Mega-samples-per-second (Msps), which translates to a TIADC sampling rate of 64 Giga-samples-per-second (Gsps).

As is described below, the reference channel 312 is used to train neural networks. In an example, at least some components of the reference subchannel may be fabricated different from corresponding components of the subchannels. That is, within the same IC device, at least some circuit elements of the reference channel may be designed to have higher accuracy than corresponding circuit elements in the M subchannels. In one example, a feature of the reference ADC that enables the reference ADC to have higher precision than the sub-ADCs is that the reference ADC operates at a lower sampling rate, or equivalently, a higher sampling period. A constraint on the sampling period of the reference ADC is that the reference ADC needs to guarantee that its sample times coincide with that of each sub-ADC of the TIADC in a way that cyclically repeats. For example, if there are N sub-ADCs, each with a sampling period T, then the sampling period of the reference ADC could be any value $k*(N+1)/N*T$, where k is a positive integer. Thus, k can be chosen to give the reference ADC a larger sampling period, or equivalently, a smaller sampling rate, than the sub-ADCs. A larger sampling period enables the reference ADC to be designed to have higher precision. For example, the reference ADC will have more time for the sampled analog voltage to settle. More settling time allows for the capacitive digital to analog converter (CDAC) capacitors to be larger because the reference ADC can afford to have a larger time constant defined as the resistance of the sampling switch multiplied by the total CDAC capacitance. A larger CDAC capacitance helps reduce noise and improve matching between the CDAC capacitors of the reference ADC. The sampling rate of the reference ADC can be as low as desired depending on constraints for overall calibration time of the TIADC. The reference ADC can also have better performance because it can be placed in an optimal location on the physical IC device, e.g., IC chip. The location may be desirable in several ways. For example, it is desirable for a sub-ADC to be placed a short distance from the sampling clock generation circuit, a short distance from the analog input signal pads, or a relatively far distance from noisy digital circuits. The reference ADC could be placed in an optimal location compared to the sub-ADCs. Through the neural network calibration procedure, all sub-ADCs would benefit from the more accurate precision of the reference ADC.

With reference to FIG. 3A, static errors of the TIADC 300 may be contributed from components in dashed box 350 and dynamic errors of the TIADC may be contributed from components in dashed box 352. Static errors may include capacitive DAC (CDAC) capacitor mismatch, offset mismatch (comparator mismatch), and gain mismatch (reference mismatch) and dynamic errors may include analog front end bandwidth gain and phase mismatch and time skew mismatch.

As illustrated in FIG. 2, the first phase calibration 202 of a TIADC may include at least one of calibration to adjust for component mismatch (e.g., CDAC capacitor mismatch), calibration to adjust for analog front end bandwidth gain and phase mismatch, calibration to adjust for offset mismatch, calibration to adjust for gain mismatch, and calibration to adjust for time-skew mismatch. In an example, the order in which the first phase calibration operations are performed is important and a preferred order from a first calibration operation to a last calibration operation is 1) component mismatch calibration (e.g., CDAC capacitor mismatch calibration), 2) analog front end bandwidth gain and phase mismatch calibration, 3) offset mismatch calibration, 4) gain mismatch calibration, and 5) time-skew mismatch calibration. In some cases, the first phase calibration may not include all five of the above-identified calibration operations but the relative order of the calibration operations that are performed is maintained. For example, if any one of the calibration operations is not included, the relative order of the calibration operations that are performed stays the same. For example, if the analog front end bandwidth gain and phase mismatch calibration operation is not included in the first phase calibration, then the preferred order of calibration operations is CDAC capacitor mismatch calibration, offset mismatch calibration, gain mismatch calibration, and time-skew mismatch calibration. In an example, the CDAC capacitor mismatch calibration occurs first in the first phase calibration because the CDAC capacitor mismatch is a mismatch that depends on the parasitic mismatch of the CDAC array capacitors. These mismatches are constant because the mismatches do not depend on the transistor devices whose physical properties change with time and temperature. Thus, the CDAC capacitor mismatch calibration is performed one time, and the calibration weights are stored for use, and do not need to be changed again. The remaining calibration procedures can be performed periodically on the TIADC to account for parameters that change with time and temperature. The analog front end bandwidth gain and phase mismatch calibration occurs next because the analog front end bandwidth gain and phase mismatch calibration is limited in terms of calibration accuracy both due to the nature of the digital detection, where which sub-ADC gain changes the most is being measure. The remaining offset, gain, and time-skew mismatch calibration operations have a precise quantitative evaluation algorithm for the mismatch detection, and thus are capable of giving more precise calibration results, assuming that the data that is being used in the algorithm is accurate. Performing the CDAC capacitor mismatch and analog front end bandwidth gain and phase mismatch before the offset, gain, and time-skew mismatch calibrations allows the precision of the offset, gain, and time-skew calibration mismatch algorithms to be more fully leveraged to improve the calibration. In an example, the time-skew calibration detection algorithm calculates an approximation to the derivative of the auto-correlation of three consecutive TIADC data samples. The calculated values converge to zero, and if there is any offset or gain mismatch between adjacent sub-ADC data, then the time-skew detection algorithm would not be accurate. The offset and gain calibration algorithms perform computations using the data of individual sub-ADCs, thus both offset and gain calibration is performed prior to time-skew calibration so that the sub-ADCs output data will have matching offset and gain, thus enabling the time-skew detection algorithm to accurately compute the derivative of the auto-correlation between adjacent sub-ADC data samples.

The two-phase calibration process is described in more detail below with reference to FIGS. 4A-12. In particular, examples of the first phase calibration operations are described with reference to FIGS. 4A-9 and examples of the second phase calibration operations are described with reference to FIGS. 10A-12. The first phase calibration operations are described in the preferred order in which the calibrations operations should be implemented.

Figure 4A:
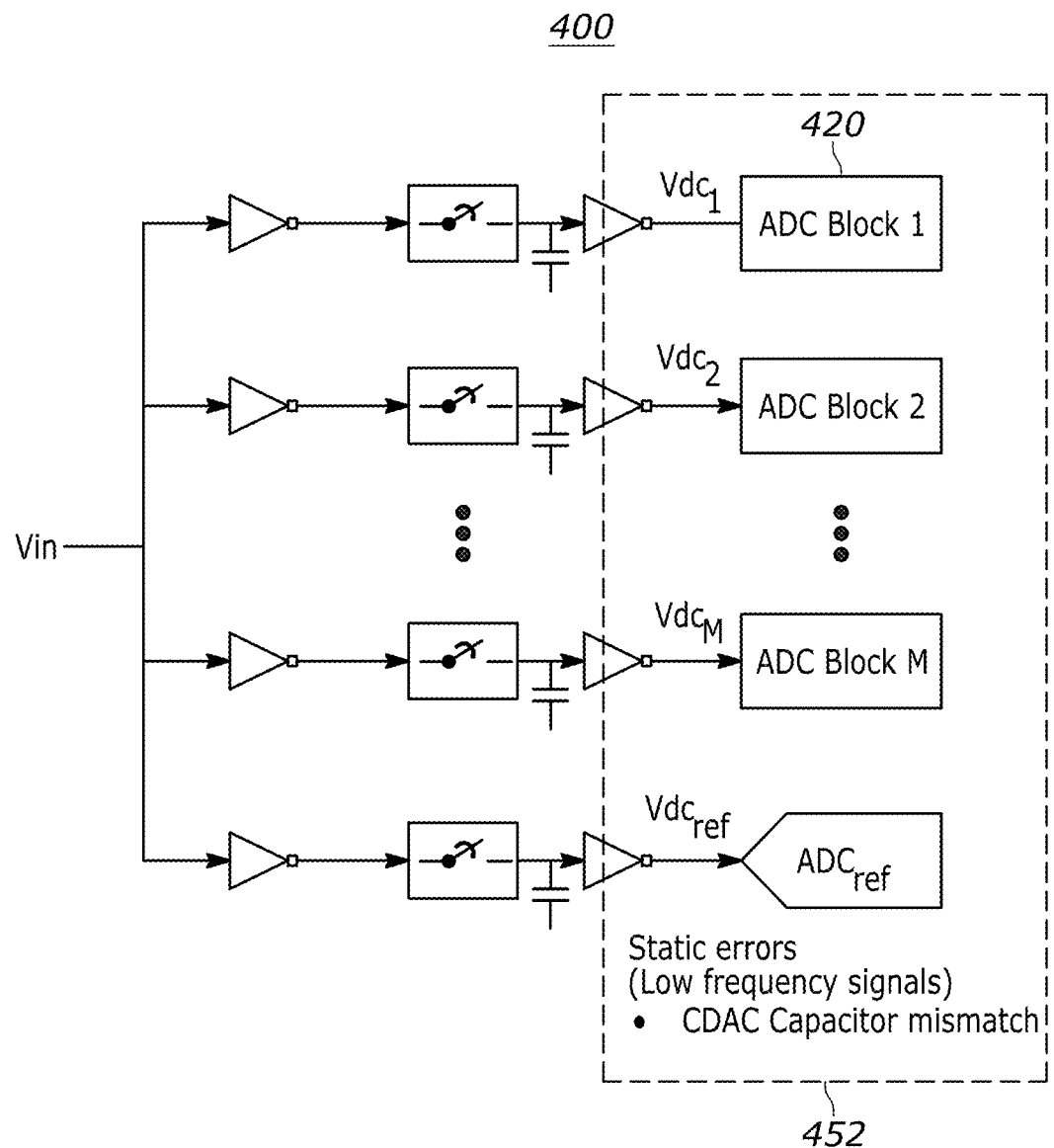
FIG. 4A depicts a TIADC such as the TIADC from FIG. 3A in which static errors in the form of CDAC capacitor mismatch are adjusted for in a CDAC capacitor mismatch calibration operation.

An example of a CDAC capacitor mismatch calibration operation is described with reference to FIGS. 4A and 4B. FIG. 4A depicts a TIADC 400 such as the TIADC 300 from FIG. 3A in which static errors (that may be contributed from components in box 452) in the form of CDAC capacitor mismatch are adjusted for in a CDAC capacitor mismatch calibration operation.

Figure 4B:
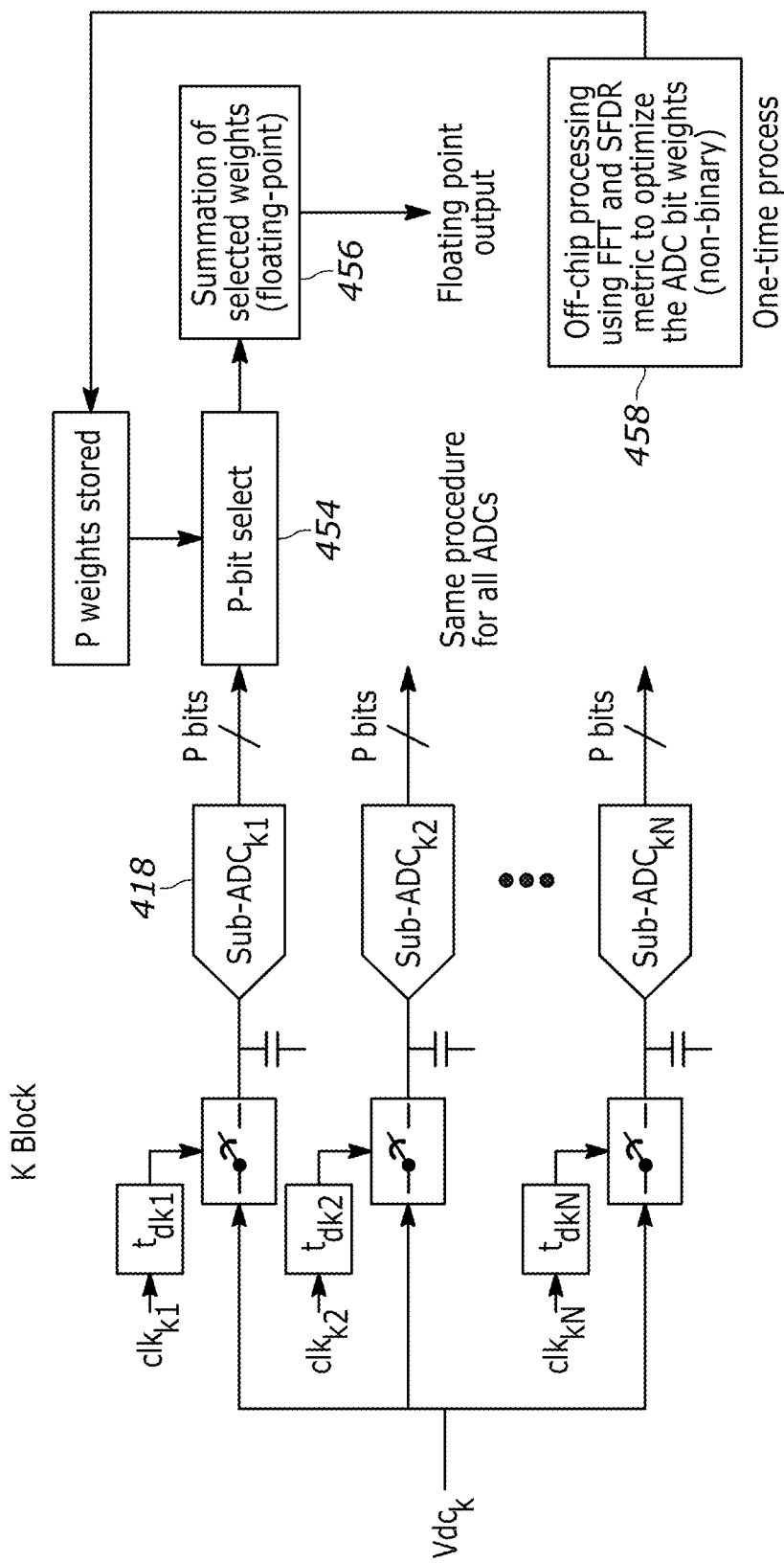
FIG. 4B is an expanded view of one of the ADC blocks from FIG. 4A.

FIG. 4B is an expanded view of one of the ADC blocks 420 from FIG. 4A that illustrates an example CDAC capacitor mismatch calibration operation. In an example, the output from each sub-ADC 418 is P bits wide. The calibration operation involves a P-bit select operation 454 followed by a summation 456 of the selected weights (floating-point) for each sub-ADC. In a one-time process 458, off-chip digital processing uses Fast Fourier Transform (FFT) and Spurious-free dynamic range (SFDR) metrics to optimize the ADC bit weights (non-binary). For example, the process involves a one-time foreground calibration using post-processing and then storing the optimal ADC weights. This can be done with a low frequency input signal, e.g., an input signal at less than the Nyquist rate of the sub-ADCs. The SFDR of each sub-ADC can be optimized individually, thus time-interleaving mismatch effects do not impair this calibration operation. Although the one-time process is described as being an off-chip process, in other examples, the process may be implemented in circuits that are integrated on the same chip as other components of the TIADC.

In an example, a weight vector, w, is calculated using ADC data post-processing in Matlab. In an example, the weight vector has one component for every sub-ADC bit, and replaces an ideal binary valued weight vector that would be used if the CDAC capacitors had perfect binary scaled sizing, as is desired for the binary search procedure that the SAR ADC performs. An example weight vector for a 4-bit ADC may be [w3, w2, w1, w0]=[8.0121, 3.9953, 2.0132, 0.9999]. The deviation of an ideal weight vector of [2^3, 2^2, 2^1, 2^0], is a measure of the CDAC capacitor array sizing mismatch. In an example, the post-processing in Matlab optimizes the weight vector, given data collected from each sub-ADC, to minimize the distortion or maximize the signal-to-noise ratio, or some combination of these two. The weight vector, w, is then programmed into the output of each sub-ADC individually. For example, given the example vector, and an example ADC output data word of [1,0,1,1], the weighting of the ADC output bits would be computed as:

$$1*w3+0*w2+1*w1+1*w0=8.0121+0+2.0132+0.9999=11.0252.$$

Whereas, without an optimized vector the ADC output would have been:

$$1*2^3+0*2^2+1*2^1+1*2^0=8+0+2+1=11.$$

If the CDAC capacitors are not perfectly binary weighted, and the weight vector has been properly optimized to account for any mismatch, then the value of 11.0252 would be a more accurate representation of the sampled analog voltage at the input to the sub-ADC than the value of 11.

In an example, each sub-ADC 418 includes digital circuits to "zero" out all other sub-ADC outputs so that a specific sub-ADC can be isolated in time-interleaved ADC output data. In an example, the reference channel is also calibrated to adjust for CDAC capacitor mismatch. For example, when the TIADC is being tested in a lab, a stream of output bits will be obtained from the TIADC, and there is no way to know which data point corresponds to a specific sub-ADC. All that is known is that the data comes from the sub-ADCs in a cyclic repeating order, but the location of sub-ADC "1", for example, is not known. By having a simple digital circuit inside of each sub-ADC, the output of every sub-ADC, except for one, can be forced to be zero. Thus, it is known that any non-zero data output came from that single sub-ADC. Then, for example in a 16-way time-interleaved ADC, it is known that every 16th data sample also belongs to that specific sub-ADC. After removing the zero data samples from all other sub-ADCs, what remains is a stream of data that came only from a specific sub-ADC. This data is used to drive the CDAC capacitor weights optimization algorithm. In an example, this process is repeated for each sub-ADC, including the reference sub-ADC. Additionally, although in the example described with reference to FIGS. 4A and 4B, the component is a CDAC capacitor, the component mismatch calibration may be applicable to other components of the TIADC.

Figure 5:
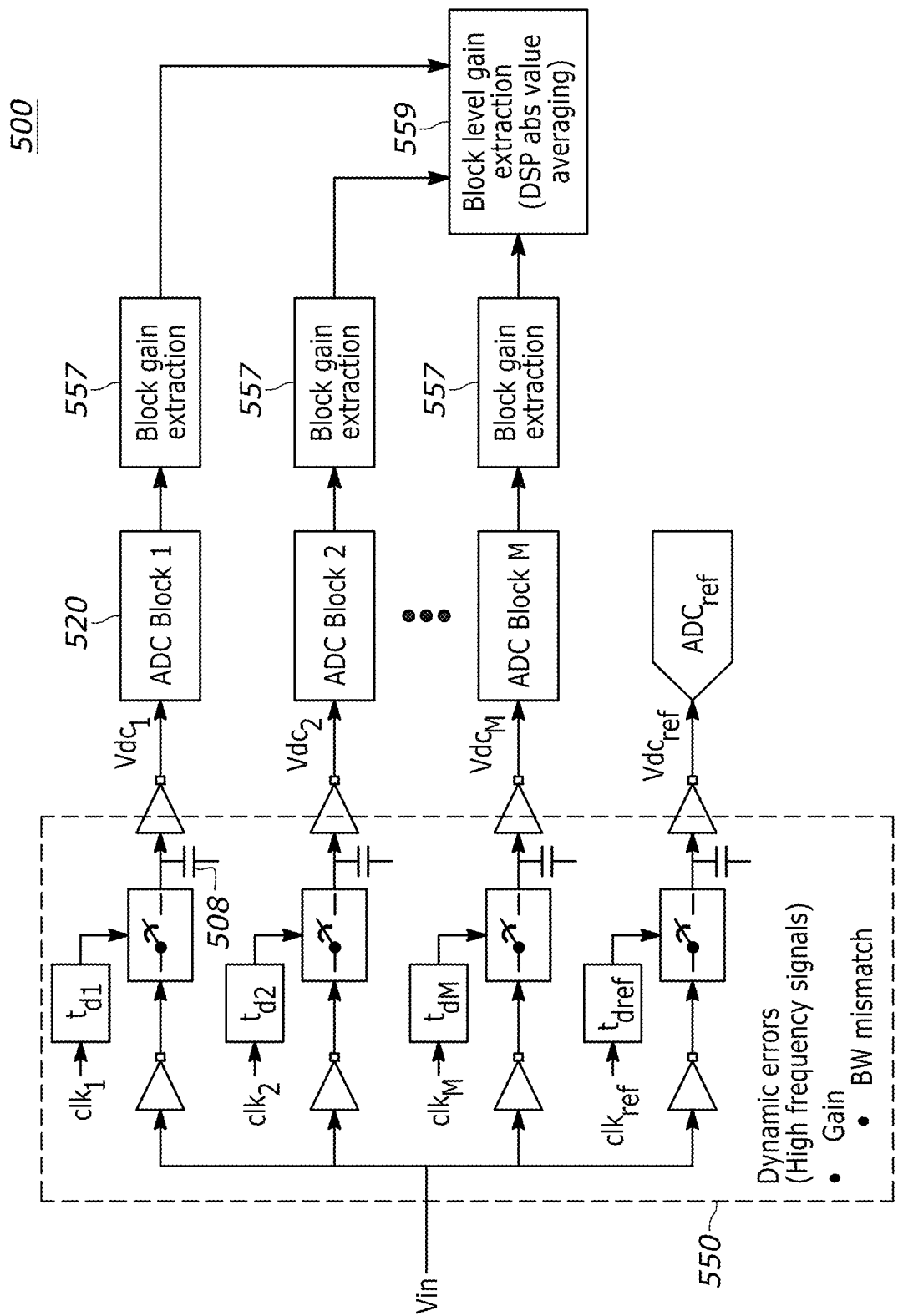
FIG. 5 depicts a TIADC such as the TIADC from FIG. 3A in which dynamic errors in the form of analog front end bandwidth gain and phase mismatch are adjusted for in an analog front end bandwidth gain and phase mismatch calibration operation.

An example of an analog front end bandwidth gain and phase mismatch calibration operation is described with reference to FIG. 5. FIG. 5 depicts a TIADC 500 such as the TIADC 300 from FIG. 3A in which dynamic errors (that may be contributed from components in box 550) in the form of analog front end bandwidth gain and phase mismatch are adjusted for in an analog front end bandwidth gain and phase mismatch calibration operation. With reference to FIG. 5, the analog front end input bandwidth is a function of buffer bias voltage (current) and the sampling capacitor 508 (may be small parasitic capacitance). FIG. 5 also illustrates subchannel-specific gain extraction operations 557 and a digital processing absolute value averaging operation 559. In an example, absolute value averaging involves: 1) all ADC blocks 520 being set to highest bandwidth by, for example, switching all unit parasitic capacitances out of the signal path, 2) extracting gain for each ADC block, 3) switching unit parasitic capacitance into signal path, 4) extracting gain for each ADC block, 5) the ADC block whose gain changes the least keeps the capacitance in its signal path, and 6) repeat some number of times. As an example, suppose that the TIADC has four sub-ADCs. The analog input signal will go through a unique circuit network to each sub-ADC that can be modeled as a low-pass filter, and at some frequency the input analog signal will experience an attenuation of 3 dB (e.g., this is a gain of 0.707). This is defined as the "3 dB bandwidth" for the network. The final stage of this input network for each sub-ADC is isolated from all other sub-ADCs after the final track/hold switch of the input network. At this point, a set of small capacitors, all of the same size, will be placed. This will be called a "unit" capacitance. The unit capacitances can be switched into or out of the analog signal path. When the unit capacitances are switched into the signal path, the 3 dB bandwidth of that network will reduce due to the extra unit capacitance. As an example, there may be four switched capacitor units. To begin with, all of the unit capacitors switched out of the analog signal path for each of the sub-ADCs. Then, the output data from each sub-ADC is used to calculate the average absolute value of the data for that sub-ADC. After a sufficient number of samples are averaged, an average absolute value is established for each sub-ADC. The, one of the four unit capacitors is switched into the analog signal path. This is done for all the sub-ADCs. Then, the average absolute value calculation is repeated for each sub-ADC. The ratio of the average absolute value is computed with the single unit capacitor switched into the analog signal path and the average absolute value without a unit capacitor switched into the analog signal path. The two ratios are then compared. The sub-ADC with the largest ratio can be deemed to have the largest 3 dB bandwidth because switching the single unit capacitor into the signal path caused the least amount of extra attenuation. For this sub-ADC, the single unit capacitor is kept switched into the analog signal path. Thus, the 3 dB bandwidth of the sub-ADC that had the largest 3 dB bandwidth has been reduced, making the 3 dB bandwidth mismatch between sub-ADCs smaller. This operation can be repeated in multiple ways. An example would be to repeat until a change in the sub-ADC that shows the largest ratio is seen, thus the 3 dB bandwidth of the sub-ADC that originally had the largest 3 dB BW has been reduced to be smaller than the sub-ADC that originally had the second largest 3 dB bandwidth. The process could be stopped at this point, or as an example, it could continue until each of the sub-ADCs becomes the sub-ADC with the largest 3 dB bandwidth. At this point, some number of unit capacitances would have been switched into the analog signal path of each sub-ADC. The calibration procedure would then be stopped. The result is that the 3 dB bandwidth of the sub-ADCs with the highest 3 dB bandwidth has been reduced so that all of the sub-ADCs can have 3 dB bandwidth values that are closer together. Note that the 3 dB bandwidth of the lower 3 dB bandwidth sub-ADCs cannot be reduced. Only the 3 dB bandwidth of the higher 3 dB bandwidth sub-ADCs can be reduced while keeping the others fixed, so that the 3 dB bandwidth mismatch is reduced. Note that the actual bandwidth value for any given subchannel is never known, all that is controlled is the relative bandwidth between the subchannels through the switched unit parasitic capacitances. In this example, the analog front end bandwidth gain and phase mismatch calibration operation involves digital domain detection and analog domain adjustment. In an example, the reference channel is also calibrated to adjust for analog front end bandwidth gain and phase mismatch. The analog front end bandwidth gain and phase mismatch calibration operation is independent of the static gain mismatch of the sub-ADCs.

Figure 6A:
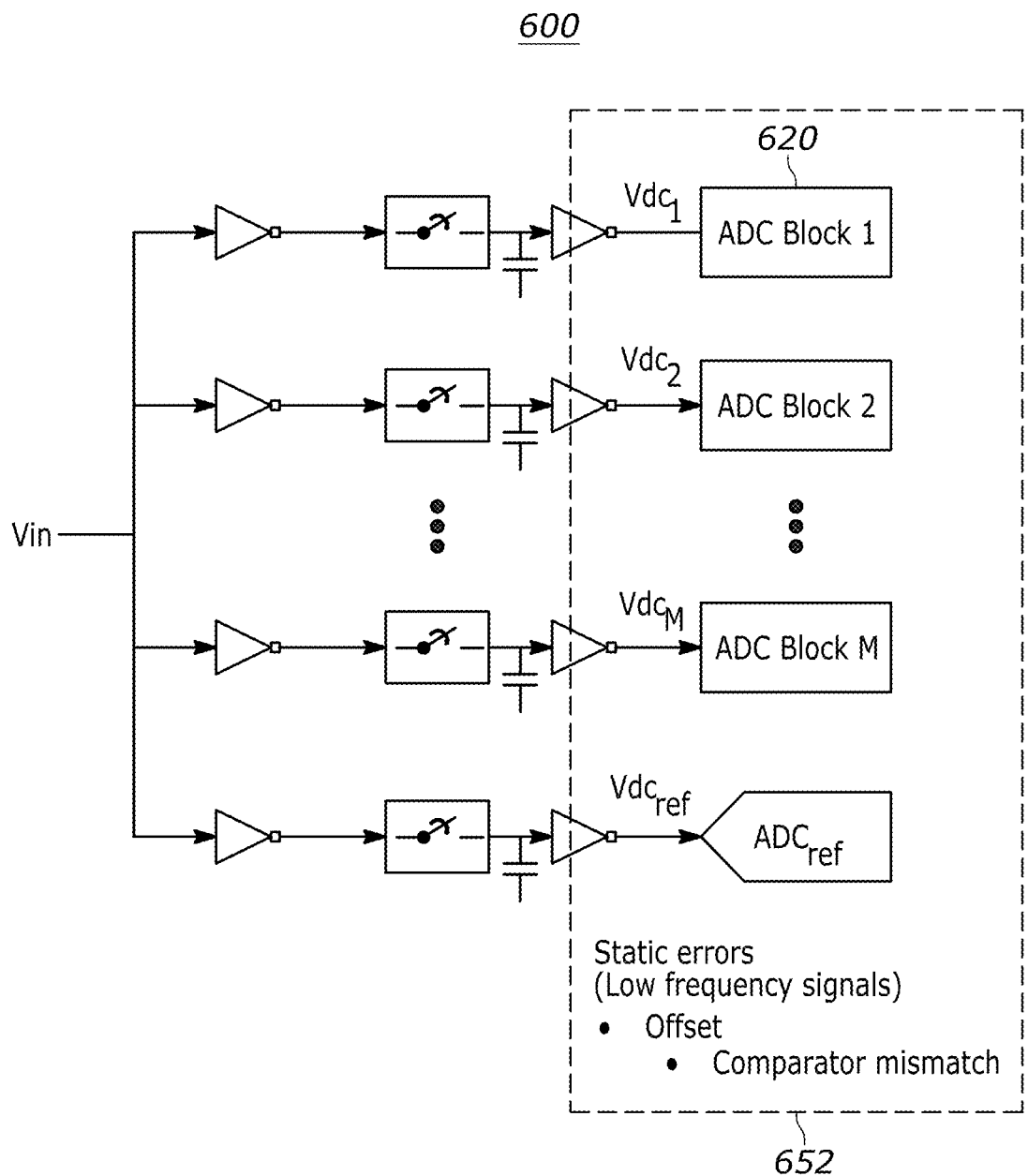
FIG. 6A depicts a TIADC such as the TIADC from FIG. 3A in which static errors in the form of offset mismatch are adjusted for in an offset mismatch calibration operation.
Figure 6B:
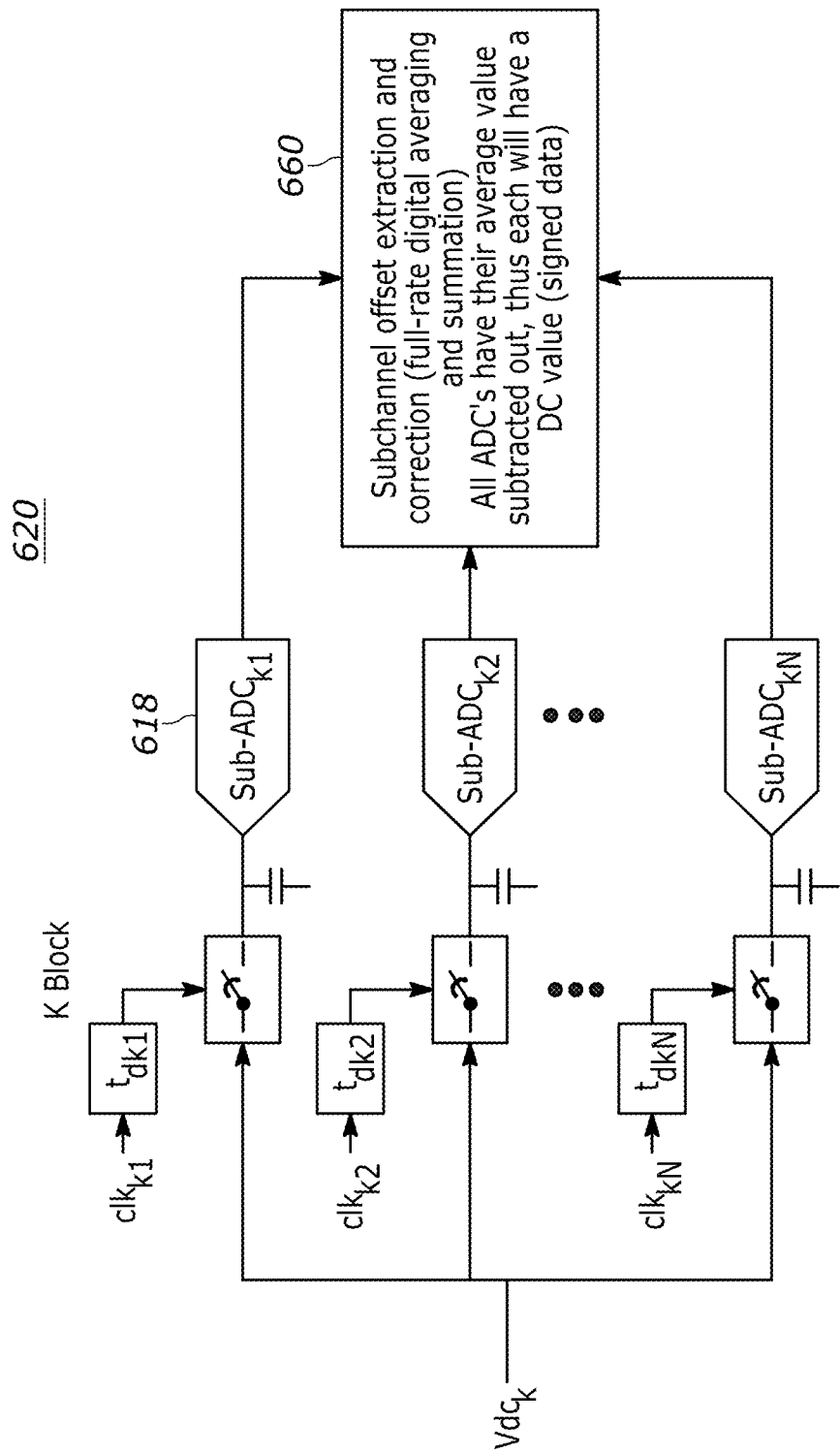
FIG. 6B is an expanded view of one of the ADC blocks from FIG. 6A.

An example of an offset mismatch calibration operation is described with reference to FIGS. 6A and 6B. FIG. 6A depicts a TIADC 600 such as the TIADC 300 from FIG. 3A in which static errors (that may be contributed from components in box 652) in the form of offset mismatch are adjusted for in an offset mismatch calibration operation. FIG. 6B is an expanded view of one of the ADC blocks 620 (e.g., the kth block) from FIG. 6A that shows the sub-ADCs 618 of the ADC block and that illustrates an example offset mismatch calibration operation. The offset mismatch calibration operation involves a subchannel offset extraction and correction operation 660 that uses full-rate digital averaging and summation to find averages. The average value of each sub-ADC is subtracted out so that each sub-ADC has a DC value (signed data). In an example, the reference channel is also calibrated to adjust for offset mismatch. In an example, the TIADC includes digital circuits (e.g., including digital addition circuits) to implement the offset extraction and adjustment. In an example, the adjusted sub-ADC output data is then used in the gain mismatch calibration described below.

Figure 7A:
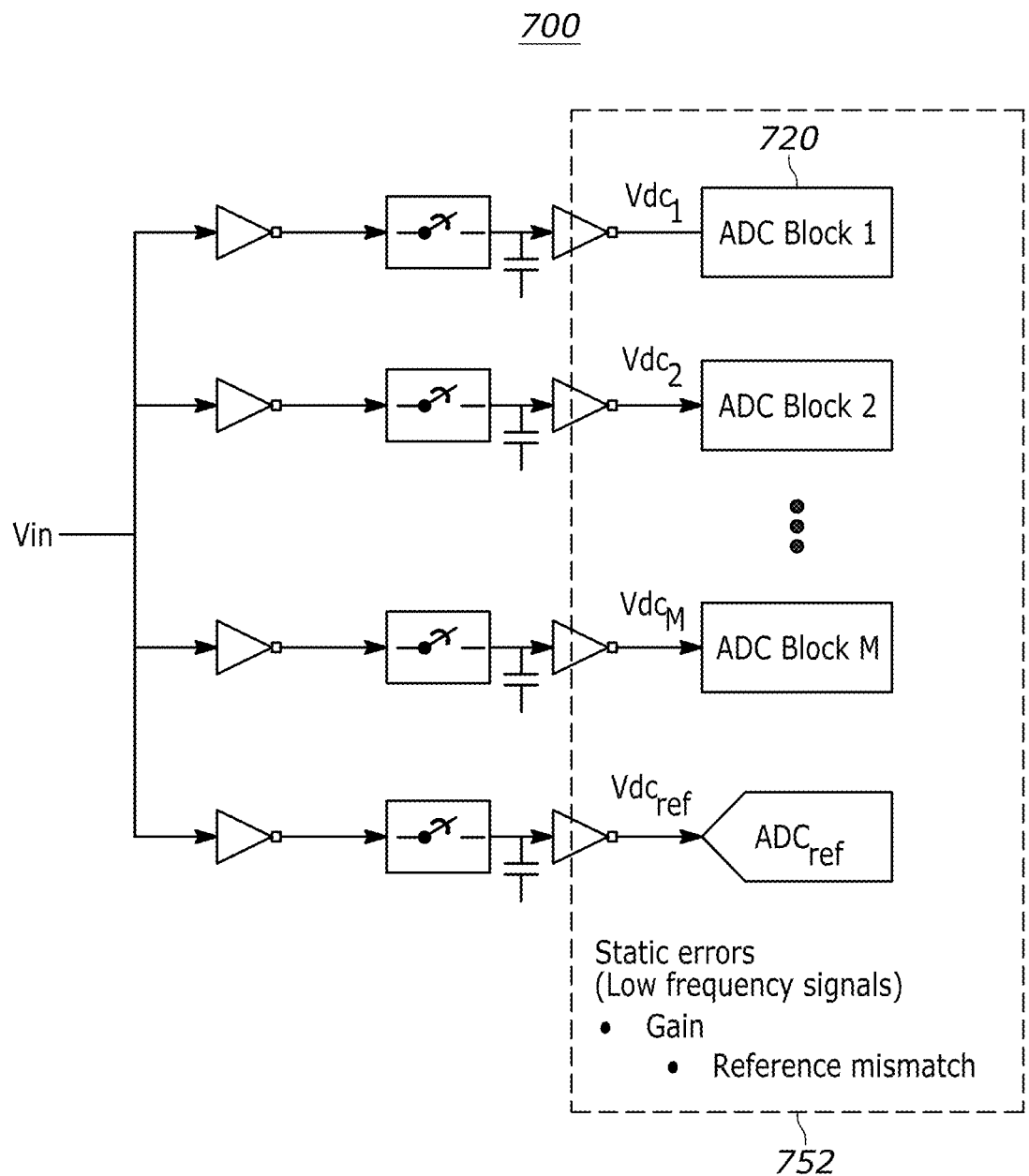
FIG. 7A depicts a TIADC such as the TIADC from FIG. 3A in which static errors in the form of gain mismatch are adjusted for in a gain mismatch calibration operation.
Figure 7B:
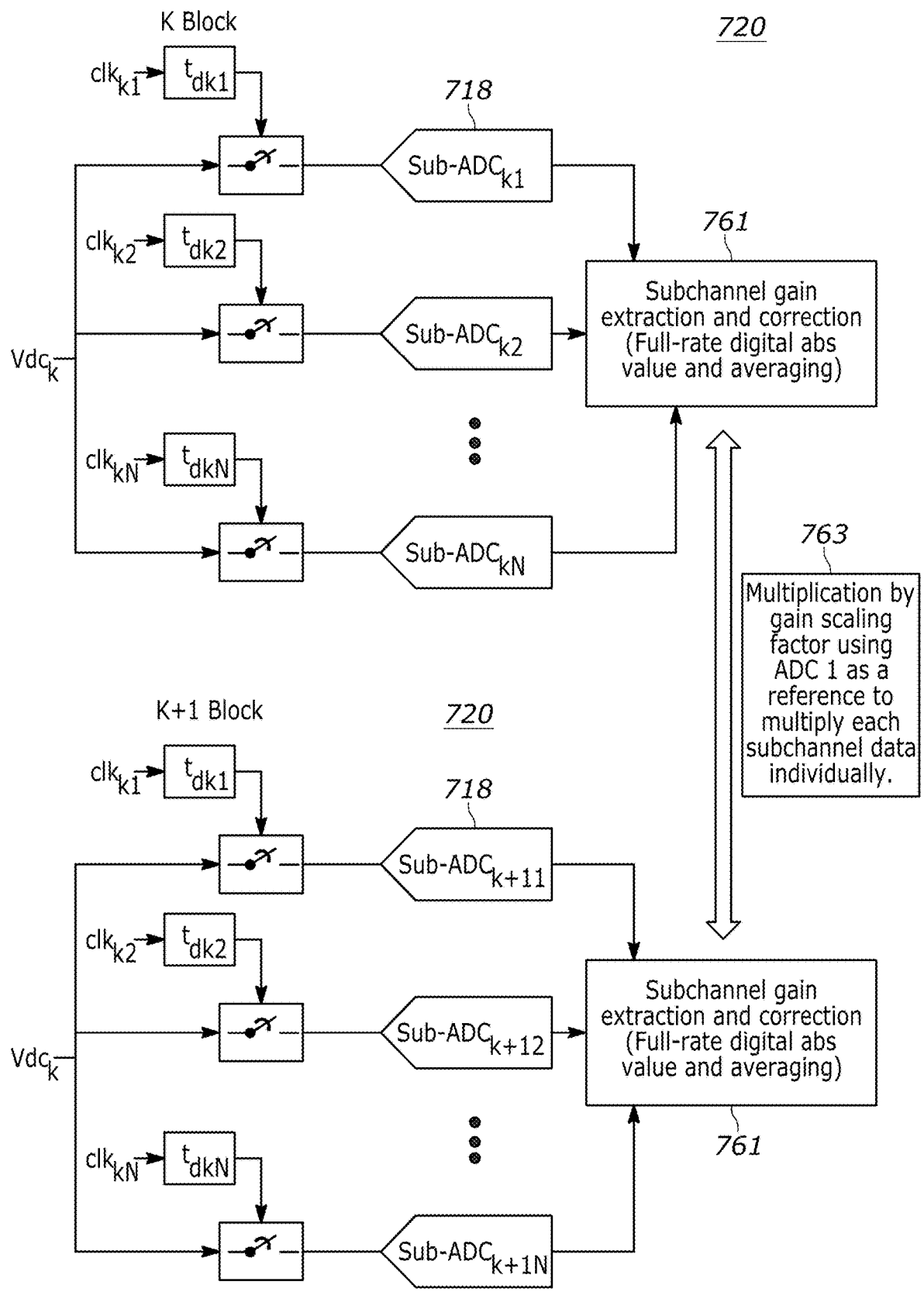
FIG. 7B is an expanded view of two of the ADC blocks from FIG. 7A.

An example of the gain mismatch calibration operation is described with reference to FIGS. 7A and 7B. FIG. 7A depicts a TIADC 700 such as the TIADC 300 from FIG. 3A in which static errors (that may be contributed from components in box 752) in the form of gain mismatch are adjusted for in a gain mismatch calibration operation. FIG. 7B is an expanded view of two of the ADC blocks 720 from FIG. 7A (e.g., ADC block k and block k+1) that illustrates an example gain mismatch calibration operation. The gain mismatch calibration operation involves subchannel gain extraction and correction (e.g., using full-rate digital absolute value and averaging) for each of the subchannels, operations 761.

Then, one of the subchannels is used as a reference (e.g., sub-ADC1, 318) and the data from each of the subchannels is multiplied by a gain scaling factor using sub-ADC1 as a reference, operation 763. This process is implemented for each subchannel. In an example, the reference channel is also calibrated to adjust for gain mismatch. In an example, each the TIADC includes digital circuits (e.g., including digital multiplication circuits) to implement the gain extraction and adjustment. In an example, the adjusted sub-ADC output data is sent to the ADC output as a digital number that has been adjusted to calibrate out the gain mismatch between the sub-ADCs.

Figure 8:
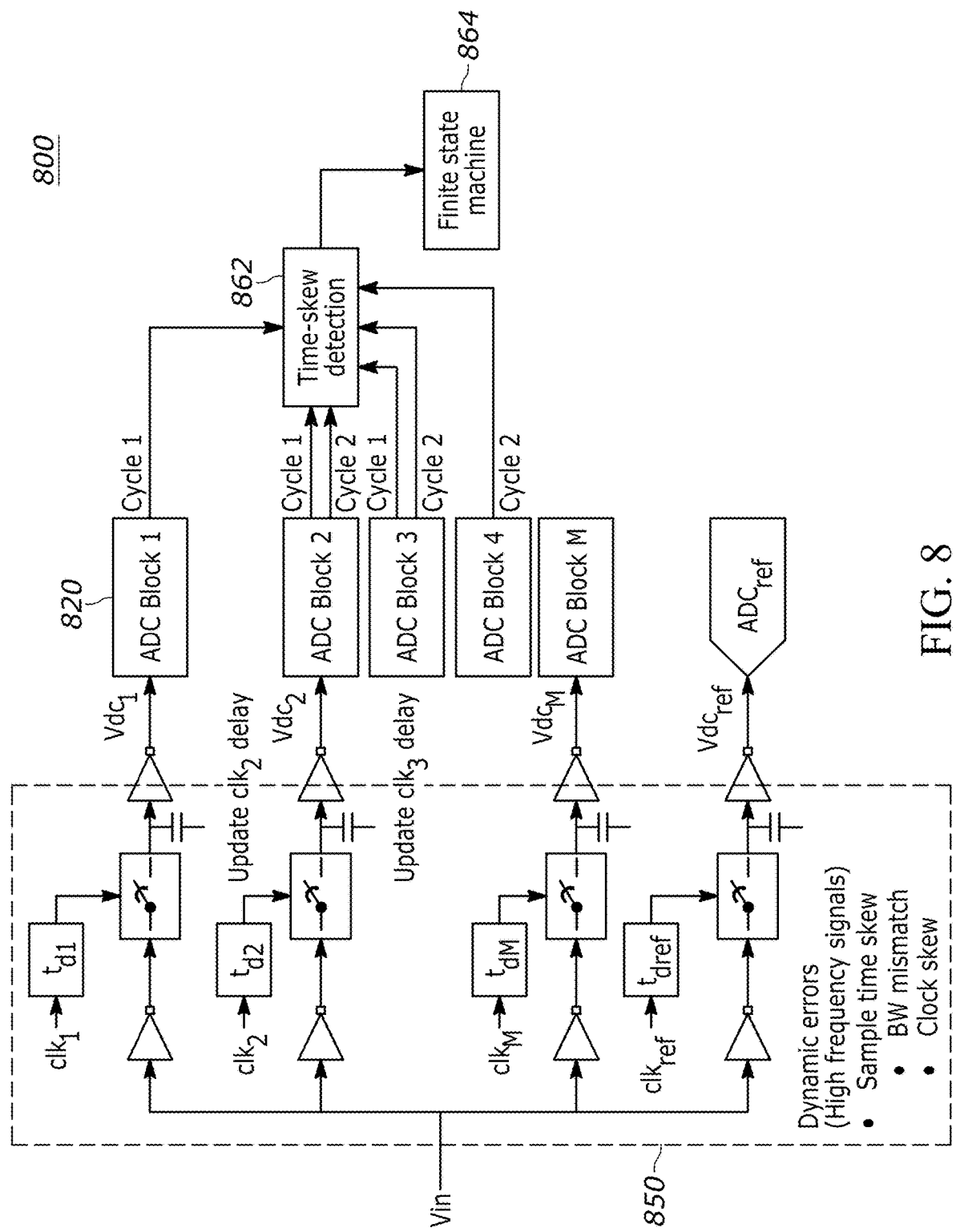
FIG. 8 depicts a TIADC such as the TIADC from FIG. 3A in which dynamic errors in the form of time skew mismatch are adjusted for in a time-skew mismatch calibration operation.

An example of the time-skew mismatch calibration operation is described with reference to FIG. 8. FIG. 8 depicts a TIADC 800 such as the TIADC 300 from FIG. 3A in which dynamic errors (that may be contributed from components in box 850) in the form of time skew mismatch are adjusted for in a time-skew mismatch calibration operation. FIG. 8 also illustrates an example time-skew mismatch calibration operation that includes a time-skew detection circuit 862 and a finite state machine 864. In an example, the time-skew mismatch calibration operation involves:

1) Capturing a single data point near to the ADC block output (e.g., full speed data). This operation is performed every Y clock cycles, wherein Y is an arbitrarily large number, for example, if the TIADC data has a sample rate of 32 giga-samples per second (Gsps), its period is 31.25 pico-seconds. No digital electronic circuits exist today that can process data samples at a rate of one sample every 31.25 pico-seconds. However, if the TIADC has 128 sub-ADCs, then the sample rate of each sub-ADC is 32 Gsps/128=250 mega-samples per second (Msps). Thus, each sub-ADC outputs a data sample every 4 nano-seconds. Digital electronic circuits are capable of processing data at a rate of one sample every 4 nano-seconds. Thus, if three consecutive outputs are captured from three consecutive sub-ADCs, the time-skew detection algorithm can be performed at a rate of 4 nano-seconds. The time-skew detection algorithm involves arithmetic operations such as addition, subtraction, and absolute value calculations. The arithmetic operations can be done at very low power if the speed further is reduced further. The accuracy of the time-skew detection algorithm depends on performing computations on three consecutive data samples. The accuracy is independent of how far apart in time any given set of three consecutive data samples is. This enables the rate at which this time-skew detection algorithm performs computations to be reduced to an arbitrarily low value for which the primary constraint is the time that can be allowed for a sufficient number of computations to calculate an effective average. In the example, if only every sixteenth set of three consecutive outputs is processed for the chosen three sub-ADCs, then computations would be performed periodically every 64×4 nano-seconds=256 nano-seconds. This is a sampling rate of approximately 3.9 Msps. Thus, if the extra time is allowed to complete the averaging procedure, the time-skew is detected between 32 Gsps data samples, while running the power hungry digital processing circuits at a much lower 3.9 Msps. In this example, the data is processed with a processing period that is 32 Gsps/3.9 Msps=8, 205 times greater than the sampling period of the TIADC output data. Equivalently, at a sample rate that is 1/8205 times smaller than the TIADC output data rate. Having a large number of clock cycles between data capture instances gives time to send the data relatively far away to a time-skew detection block, e.g., a digital signal processor (DSP) block that is configured for time-skew detection. In the example of FIG. 8, two cycles are illustrated with cycle 1 including samples from ADC blocks 1, 2, and 3 going to the time-skew detection circuit, and cycle 2 including samples from ADC blocks 2, 3, and 4 going to the time-skew detection circuit. In an example, each ADC block 820 has a single physical connection to the time-skew detection circuit 862, but the data for a specific set of three adjacent ADC blocks is chosen from all of the ADC blocks. In an example, the time-skew detection block may be implemented using a select logic circuit and a MUX circuit;

2) Update a finite state machine (FSM) at X*Y clock cycles, where X is approximately 2^15 (e.g., long averaging), the finite state machine does not need to work quickly;

3) Cycle through all of the blocks multiple times until all subclocks (e.g., $clk_1$-$clk_M$) are aligned to a midpoint of adjacent clocks.

In an example, the subclocks of the subchannels are adjusted by adjusting the delay elements of the subchannels. In an example, the detection algorithm works with full-rate ADC data triplets (e.g., digital data from three different sub-ADCs), but the digital logic works at/Y rate. Y can be chosen to be as large as desired at the cost of convergence time. The time-skew mismatch calibration operation is not applied to the reference channel.

Figure 9:
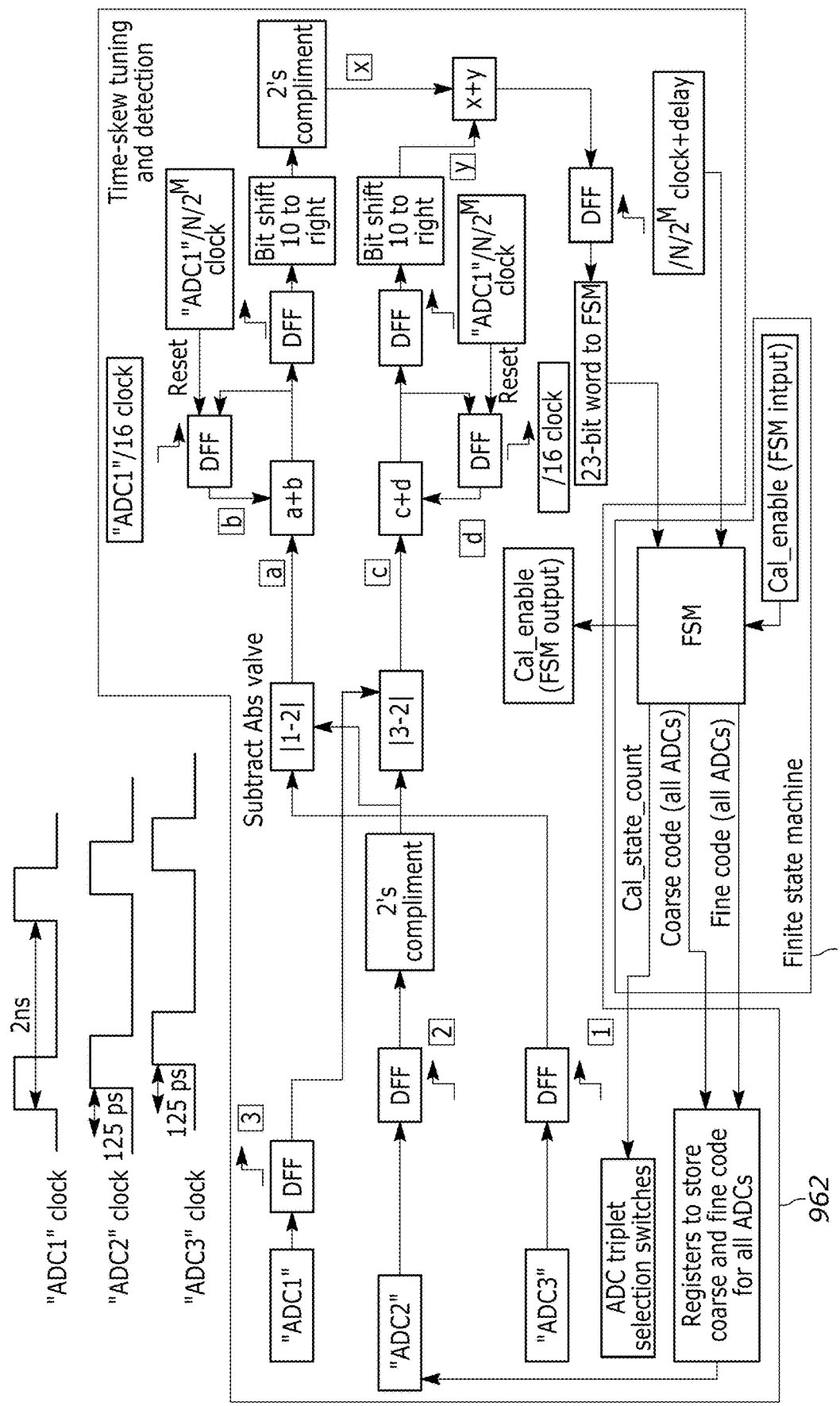
FIG. 9 is an example of a time-skew detection circuit and finite state machine that are configured to implement time-skew mismatch calibration.

In the example described with reference to FIG. 8, the time-skew mismatch calibration operation utilizes a time-skew detection circuit 862 and a finite state machine 864. FIG. 9 is an example of a time-skew detection circuit 962 and finite state machine 964 that are configured to implement time-skew mismatch calibration. The example of FIG. 9 also illustrates three signals (e.g., a "triplet" of subclocks from ADC1, ADC2, and ADC3. The time-skew detection circuit uses an arrangement of delay flip-flops (DFFs), subtractors, adders, multipliers, and other digital logic to detect time skew between various different sub-ADCs and to generate digital values that can be used to adjust clock delay elements of the corresponding subchannels. In an example, the time-skew detection circuit uses a phase-frequency detector type circuit to generate a pulse whose falling edge is triggered by the third sub-ADC clock signal. Thus, there will always be a sequence of sub-ADC, e.g., sub-ADCs 1,2,3, clock and data to enter into the digital circuits to approximate the derivative of the auto-correlation function of three consecutive sub-ADC samples. The sampling of three consecutive sub-ADCs occurs in parallel at the rate of each sub-ADC. Thus, TIADC data can be sampled at rates of 64 Gsps, at a much lower sub-ADC rate of 4 Gsps or less. The sampling process can be repeated at a highly downsampled rate allowing simple, slow, low power digital circuits to process the data and detect the time-skew between adjacent sampling clock edges.

As illustrated in FIG. 2, the second calibration phase 204 is implemented after the first calibration phase 202. The second calibration phase involves training neural networks to approximate a nonlinear function of each of the subchannels of the TIADC using an output from a reference channel as a ground truth. The second calibration phase may involve subchannel level training of neural networks or sub-ADC level training of neural networks.

Figure 10A:
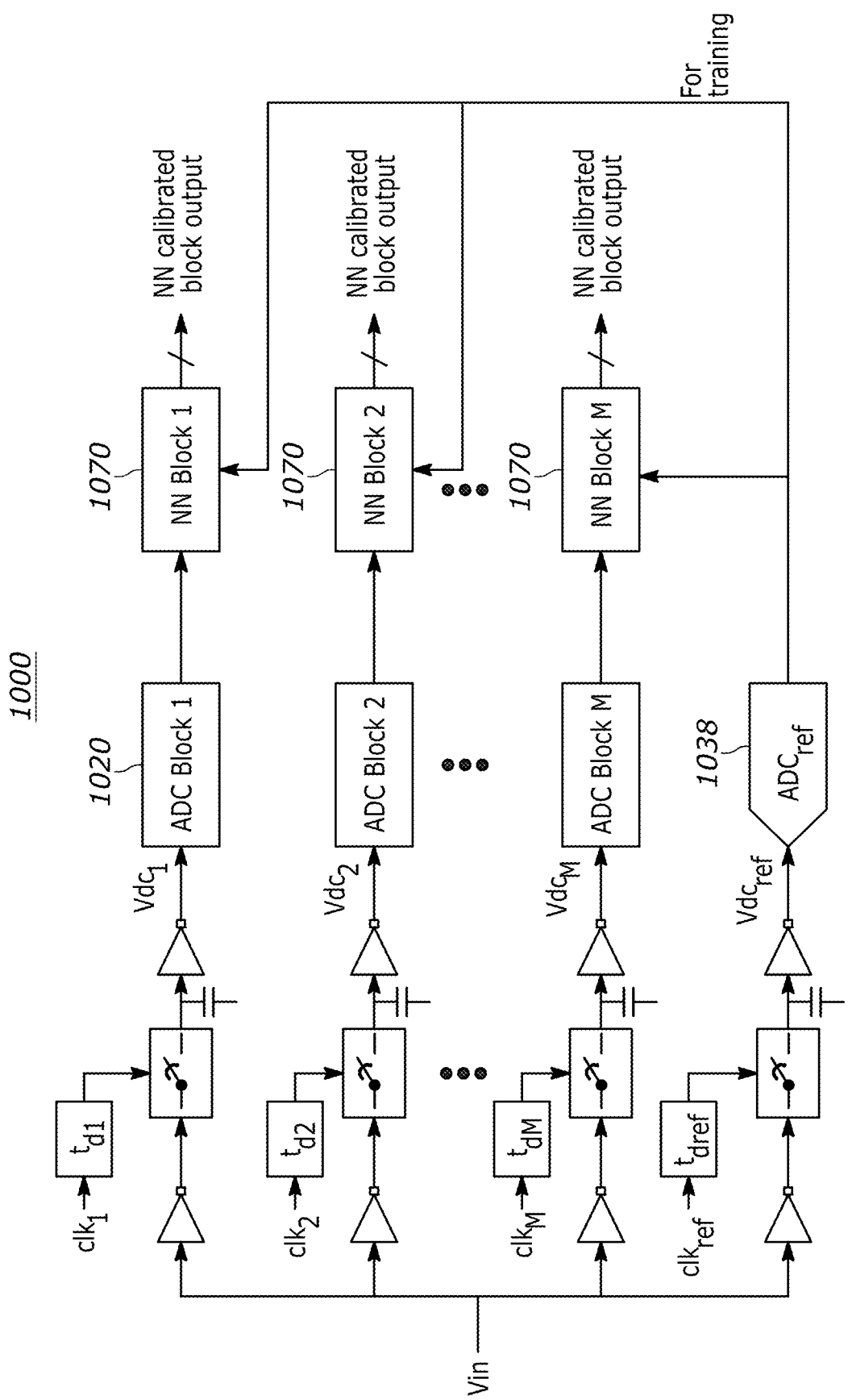
FIG. 10A depicts a TIADC such as the TIADC from FIG. 3A in which an output from the reference ADC is used as a ground truth to train subchannel-level neural networks.
Figure 10B:
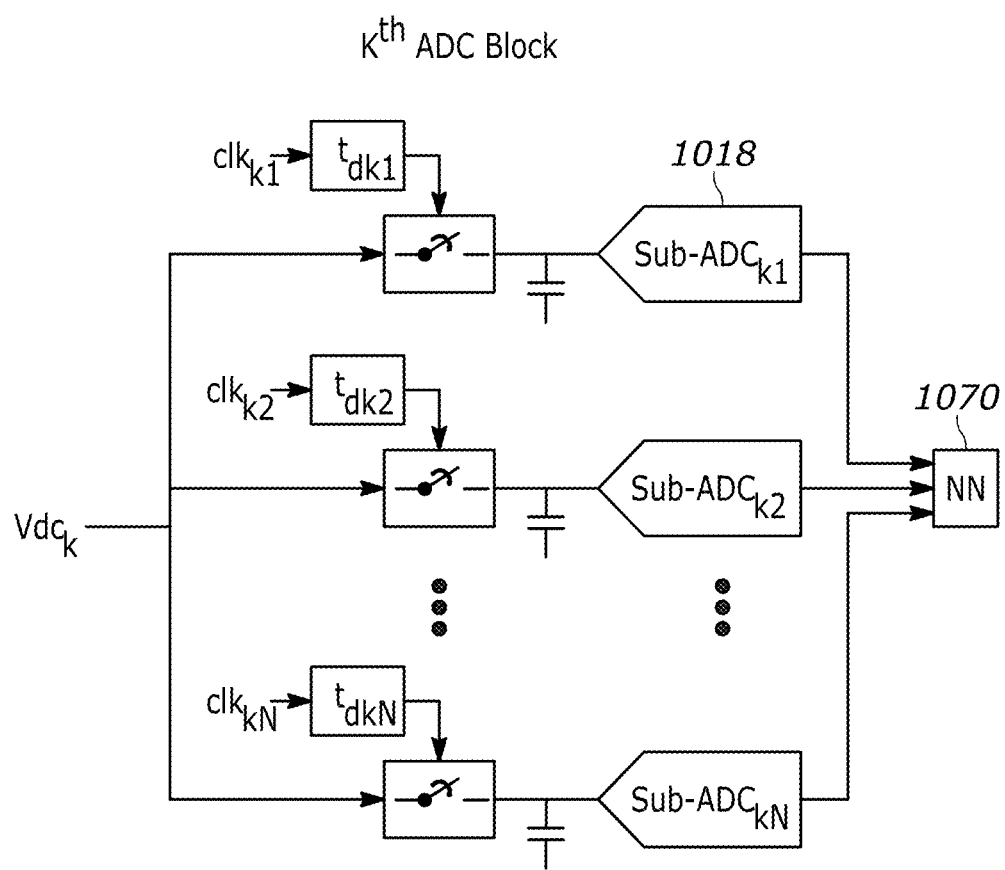
FIG. 10B is an expanded view of one of the ADC blocks from FIG. 10A relative to a corresponding subchannel-level neural network.

An example of a subchannel-level neural network training calibration operation is described with reference to FIGS. 10A-10C. FIG. 10A depicts a TIADC 1000 such as the TIADC 300 from FIG. 3A in which an output from the reference ADC 1038 is used as a ground truth to train subchannel-level neural networks 1070. FIG. 10B is an expanded view of one of the ADC blocks 1020 (e.g., the kth block) from FIG. 10A relative to a corresponding subchannel-level neural network 1070.

As illustrated in FIG. 10A, the output from the reference ADC 1038 of the reference channel is provided to each of the subchannel-level (e.g., ADC block-specific) neural networks 1070 individually. The output from the reference channel is used as a ground truth to train each of the subchannel-level neural networks. In an example, the reference ADC is clocked at a prime ratio of the block level sampling rate, fs. Thus, the sample time of the reference clock will periodically align with each of the subchannels.

Figure 10C:
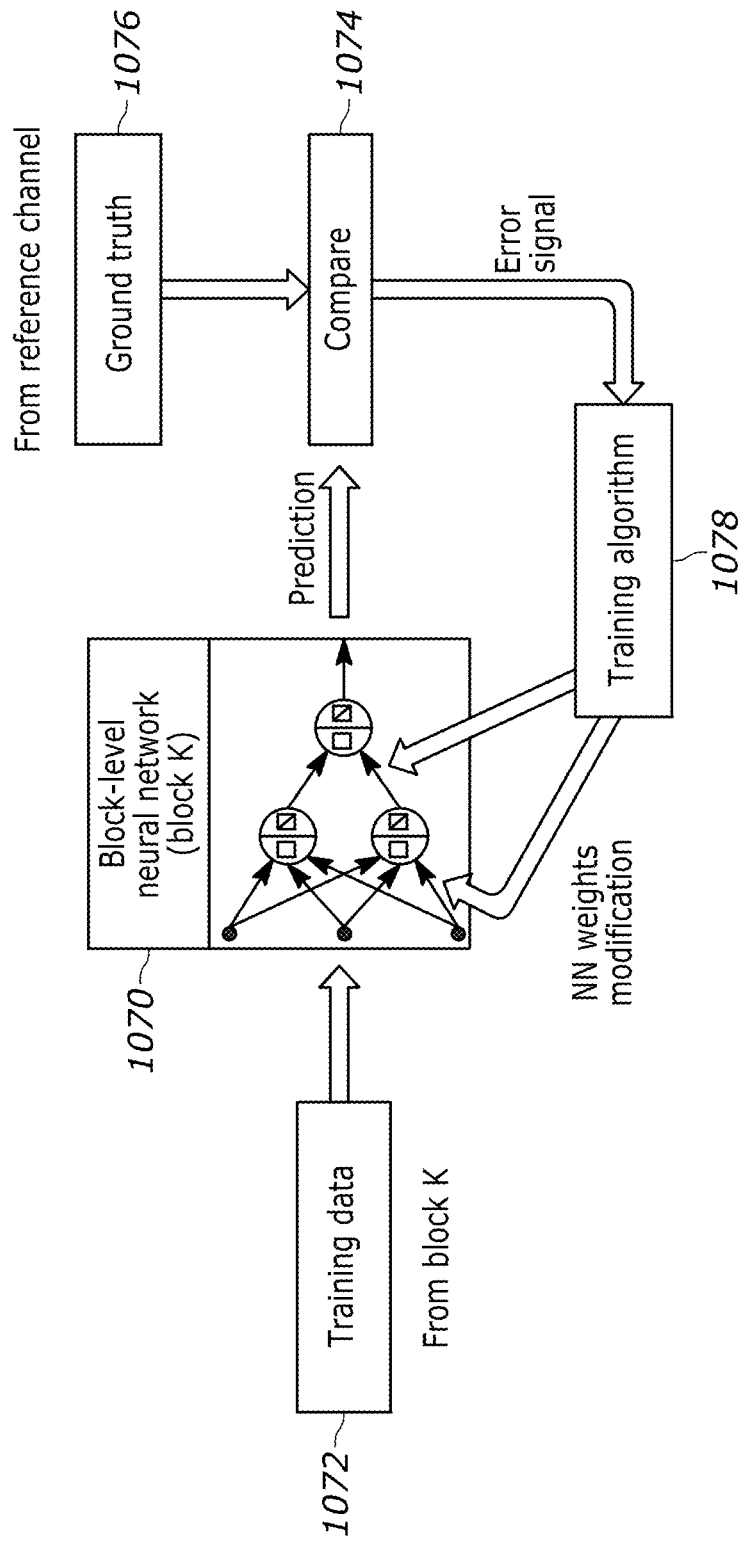
FIG. 10C illustrates an example of a training process for one of the subchannel-level neural networks from FIG. 10A.

FIG. 10C illustrates an example of a training process for one of the subchannel-level neural networks 1070 (e.g., the kth neural network) from FIG. 10A. As illustrated in FIG. 10C, the neural network includes neurons and generates predictions based on training data 1072 received from the ADC block of the corresponding subchannel. The predictions are compared 1074 to ground truths 1076 received from the reference ADC of the reference channel and an error signal is provided to a training algorithm 1078 that makes adjustments to weights with the goal of minimizing the error signal. Example, neural network training algorithms may include gradient descent, backpropogation, and Levenberg-Marquardt algorithms. Example neural network training techniques may include regularization, dropout, hyperparameter tuning, grid search, random search, and Bayesian optimization. In an example, the process can be repeated until a satisfactory error signal is achieved. Although an example of a training process is described, other training processes may be implemented. Once the neural network is adequately trained and the weights are set, the neural network can be deployed in the TIADC for inference operations.

In the subchannel-level example of FIGS. 10A-10C, all of the subchannel-level neural networks 1070 of the TIADC 1000 are trained and then the subchannel-level neural networks can be used to adjust the outputs from the ADC blocks 1020 in an inference operation. Benefits of using subchannel-level neural networks as described with reference to FIGS. 10A-10C include that fewer neural networks are needed for the TIADC. For example, only M neural networks are needed for M subchannels. Drawbacks to using subchannel-level neural networks include that more complicated transfer functions need to be learned and a faster processing rate is needed for the neural network digital circuits to implement operations including multiplication and addition operations.

Figure 11A:
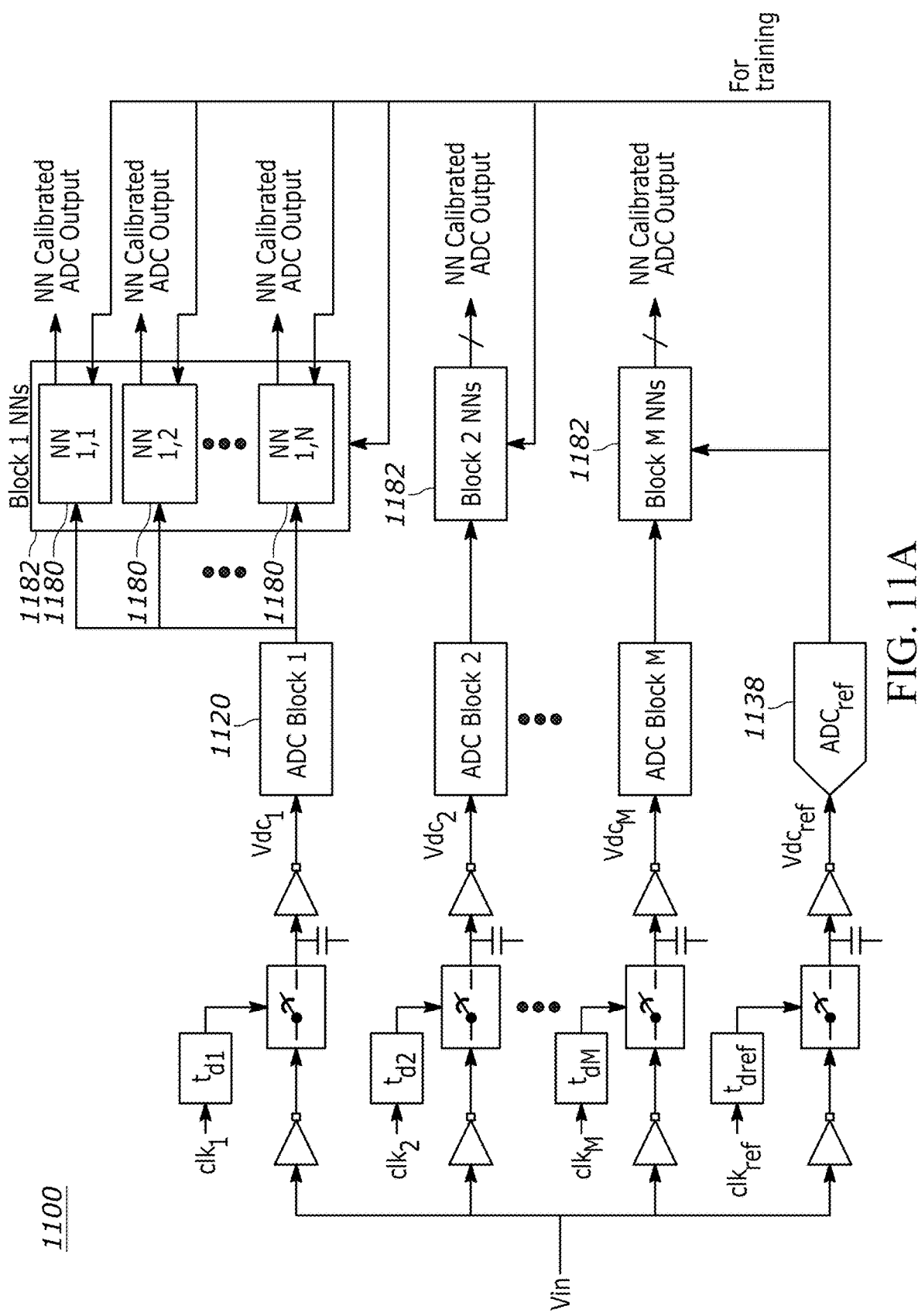
FIG. 11A depicts a TIADC such as the TIADC from FIG. 3A in which an output from the reference ADC is used as a ground truth to train the sub-ADC-level neural networks in a channel-specific group of neural networks.
Figure 11B:
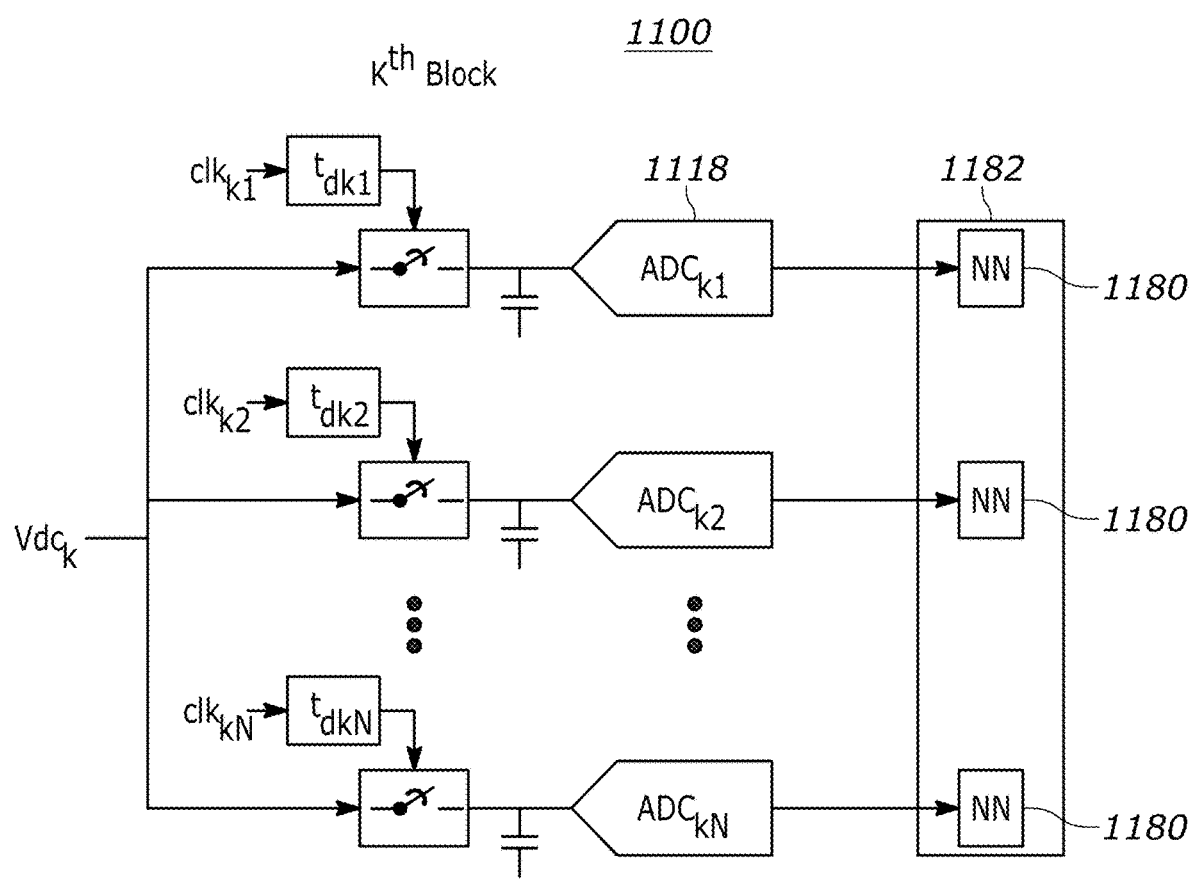
FIG. 11B is an expanded view of one of the ADC blocks from FIG. 11A relative to the corresponding sub-ADC-level neural networks.

An example of a sub-ADC level neural network training calibration operation is described with reference to FIGS. 11A-11C. FIG. 11A depicts a TIADC 1100 such as the TIADC 300 from FIG. 3A in which an output from the reference ADC 1138 is used as a ground truth to train the sub-ADC-level neural networks 1180 in a channel-specific group of neural networks 1182. FIG. 11B is an expanded view of one of the ADC blocks (e.g., the kth ADC block) from FIG. 11A relative to the corresponding sub-ADC-level neural networks.

As illustrated in FIG. 11A, the output from the reference ADC 1138 of the reference channel is provided to each of the sub-ADC-level (e.g., sub-ADC-specific) neural networks 1180 individually. The output from the reference channel is used as a ground truth to train each of the sub-ADC-level neural networks. In an example, the reference ADC is clocked at a prime ratio of the block level sampling rate, fs. Thus, the sample time of the reference clock will periodically align with each of the sub-ADCs.

Figure 11C:
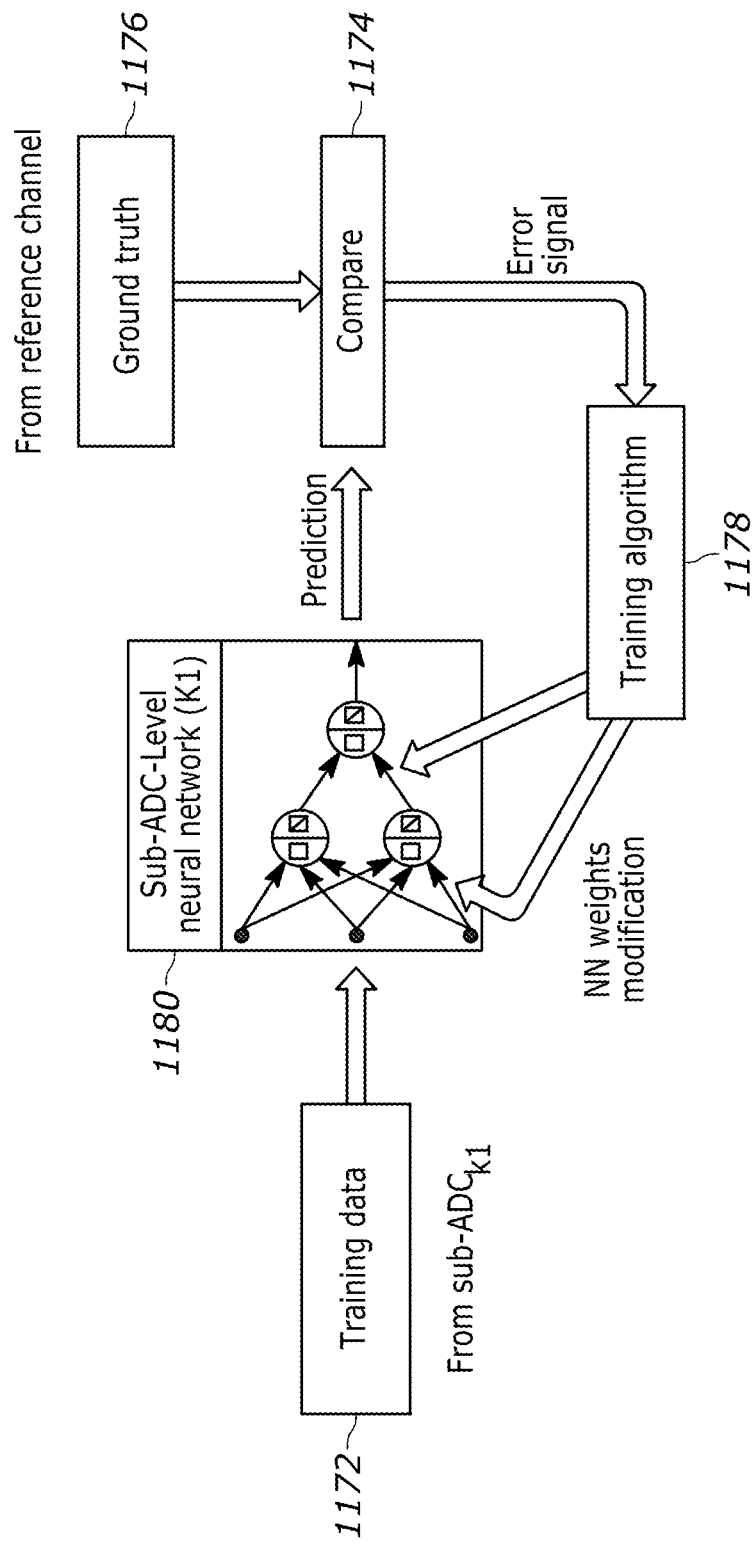
FIG. 11C illustrates an example of a training process for one of the sub-ADC-level neural networks from FIG. 11A.

FIG. 11C illustrates an example of a training process for one of the sub-ADC-level neural networks 1180 (e.g., the k1 neural network) from FIG. 11A. As illustrated in FIG. 11C, the neural network includes neurons and generates predictions based on training data 1172 received from the sub-ADC 1118 of the corresponding subchannel, e.g., $ADC_{k1}$. The predictions are compared 1174 to ground truths 1176 received from the reference ADC 1138 of the reference channel and an error signal is provided to a training algorithm 1178 that makes adjustments to weights with the goal of minimizing the error signal. Example, neural network training algorithms may include gradient descent, backpropogation, and Levenberg-Marquardt algorithms. Example neural network training techniques may include regularization, dropout, hyperparameter tuning, grid search, random search, and Bayesian optimization. In an example, the process can be repeated until a satisfactory error signal is achieved. Although an example of a training process is described, other training processes may be implemented. Once the neural network is adequately trained and the weights are set, the neural network can be deployed in the TIADC for inference operations.

In the sub-ADC-level example of FIGS. 11A-11C, the sub-ADC-level neural networks 1180 are trained and then the sub-ADC-level neural networks can be used to adjust the outputs from the subchannel ADC blocks 1120 in an inference operation. Benefits of using sub-ADC-level neural networks include that less complicated transfer functions need to be learned for each sub-ADC-level neural network and a slower processing rate can used for the neural network digital circuits to implement operations including multiplication and addition operations. A drawback to sub-ADC level neural networks is that M×N neural networks are needed. Thus, in the example of FIG. 11A, 128 (16×8) neural networks are needed.

Figure 12:
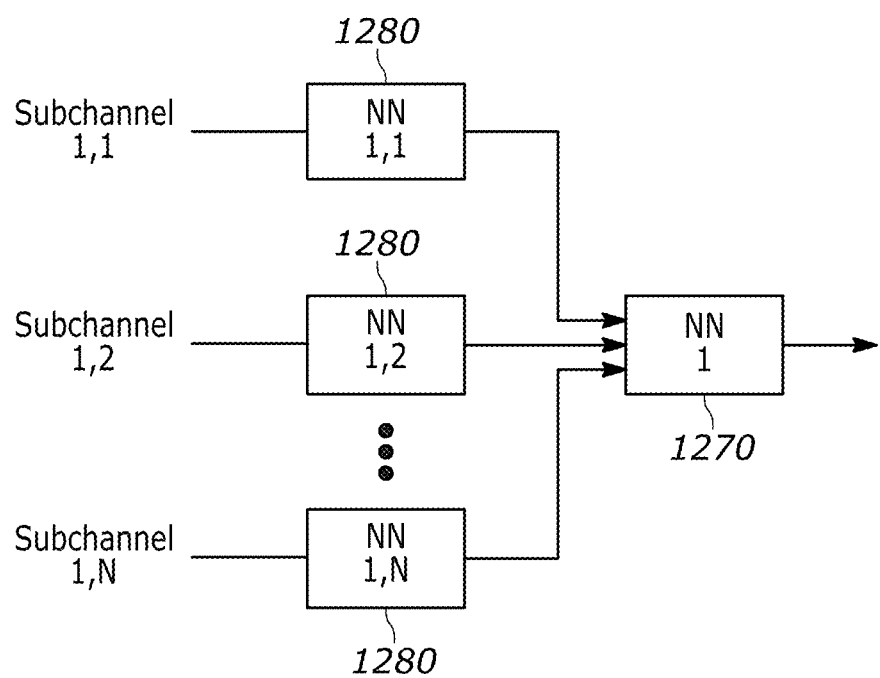
FIG. 12 illustrates an example implementation in which neural networks as described with reference to FIGS. 10A-10C and 11A-11C are used in series.

The FIG. 12 illustrates an example implementation in which neural networks as described with reference to FIGS. 10A-10C and 11A-11C are used in series. As illustrated in FIG. 12, a subchannel (e.g., subchannel 1) may have multiple sub-ADC-level neural networks 1180 (e.g., NN 1,1, NN 1, 2, ... NN 1,N) linked in series to a subchannel-level neural network 1270 (NN 1). The sub-ADC-level neural networks 1180 may be trained as described with reference to FIGS. 11A-11C and the subchannel-level neural network 1270 may be trained as described with reference to FIGS. 10A-10C.

Figure 13:
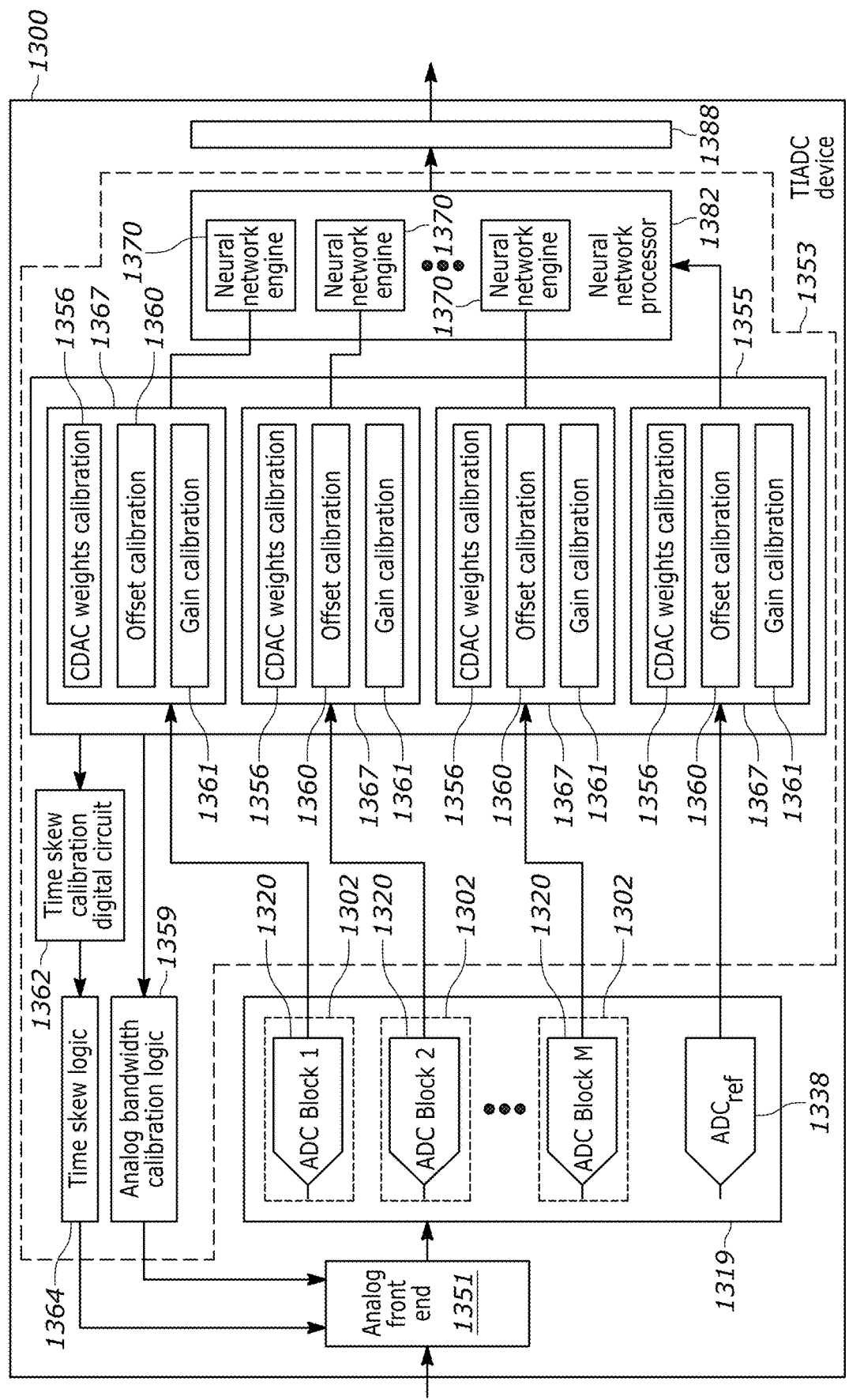
FIG. 13 is a functional block diagram of an example of a TIADC IC device that is configured to implement one or more of the calibration operations described herein.

The calibration operations described herein with reference to FIGS. 1A-12 may be implemented in whole or in part in a single integrated circuit (IC) device. FIG. 13 is a functional block diagram of an example of a TIADC IC device 1300 that is configured to implement one or more of the calibration operations described herein. With reference to FIG. 13, the TIADC IC device includes an analog front end 1351, a bank of ADCs 1319 that includes multiple ADC blocks 1320 and a reference ADC 1338, and digital processing circuits 1353 that include calibration logic 1355, a neural network processor 1382, analog bandwidth calibration logic 1359, time skew calibration digital circuit 1362, and time skew logic 1364.

In an example, the analog front end 1351 is configured to receive an analog input signal (e.g., an input voltage, Vin) and to condition the analog input signal for digitization. The analog front end may include one or more signal conditioning components such as anti-aliasing filters, variable-gain amplifiers, and sample-and-hold circuits. The components of the analog front end collectively serve to attenuate out-of-band frequency components, normalize signal amplitude, and stabilize the analog input signal for subsequent sampling by the sub-ADCs.

The conditioned analog input signal is provided to the ADC blocks 1320 that correspond to the subchannels 1202 of the TIADC 1200. Each subchannel includes a sub-ADC that is configured to operate at a sampling frequency that is offset in time relative to the other sub-ADCs. For example, the TIADC includes M sub-ADC channels as described herein. Each subchannel may sample the input signal at a rate of fs, with sampling instants staggered by (1/M)×T, where T is the period corresponding to the overall system sampling frequency of M×fs. Each sub-ADC outputs a sequence of digital samples corresponding to its time-interleaved sampling phase. The outputs are received by the digital processing circuits 1353, which are configured to interleave the digital outputs from the sub-ADCs and produce a continuous high-rate digital output stream. The digital processing circuits may additionally perform calibration and correction operations to mitigate inter-channel mismatches such as offset error, gain variation, and timing skew as described herein.

The digital processing circuits 1353 include a set 1355 of channel-specific calibration circuits 1367 that include a CDAC weight circuit 1356, an offset calibration circuit 1360, and a gain calibration circuit 1361. In an example, the CDAC weight circuit 1356 is configured to implement operations as described with reference to FIGS. 4A and 4B, the offset calibration circuit 1360 is configured to implement operations as described with reference to FIGS. 6A and 6B, and the gain calibration circuit 1361 is configured to implement operations as described with reference to FIGS. 7A and 7B. In an example, the time skew calibration digital circuit 1362 is configured to implement operations as described with reference to FIG. 8 and the time skew logic 1364 is configured to implement operations as described with reference to FIG. 9. In an example, the analog bandwidth calibration logic 1359 is configured to implement operations as described with reference to FIG. 5.

The neural network processor 1382 is configured to perform operations as described with reference to FIGS. 10A-10C, 11A-11C, and 12. The neural network processor may include channel-specific neural network engines 1370 and the neural network processor is communicatively coupled to the outputs of the sub-ADCs or to intermediate outputs of the digital processing circuits 1353. The neural network processor is configured to execute a trained neural network model that estimates and corrects complex, nonlinear, or time-varying errors introduced by the sub-ADCs or other components in the signal path. The neural network may be trained on representative input data as described herein and may be implemented using digital logic, dedicated neural processing hardware, or firmware executed on a general-purpose processor. In some embodiments, the neural network processor may adapt its parameters in real time in response to variations in temperature, supply voltage, process characteristics, or long-term aging.

The output of the neural network processor 1382 is provided to an output interface 1388 that is configured to format the high-speed corrected digital signal for communication with downstream digital systems. The output interface may support one or more output protocols, including but not limited to low-voltage differential signaling (LVDS), serial/deserializer (SerDes) protocols, JESD204-compliant interfaces, or custom parallel output buses.

In certain embodiments, all of the components described with reference to FIG. 13 are fabricated on a single semiconductor die, thereby forming a fully integrated TIADC system on a chip. Integration in a monolithic IC device provides advantages including reduced form factor, minimized interconnect parasitics, improved timing coordination among components, and lower overall power consumption. In other examples, the elements described with reference to FIG. 13 may be implemented on multiple integrated circuit devices that are, for example, coupled to a printed circuit board (PCB).

Although the calibration techniques disclosed herein are described with reference to an ADC, the calibrations techniques are applicable to other data converters, including for example digital-to-analog converters (DACs). Additionally, the TIADCs are described as having samplers 306, the data converters may utilize other quantizers.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for calibrating a time-interleaved analog to digital converter (TIADC), the method comprising:
   a first calibration phase that involves adjusting for at least one of offset error, gain error, and time skew of M subchannels of the TIADC; and
   a second calibration phase that is implemented after the first calibration phase and that involves training a neural network to approximate a non-linear function of each of the M subchannels of the TIADC using an output from a reference channel as a ground truth.

2. The method of claim 1, wherein the first calibration phase includes adjusting for at least one of component mismatch, analog front end bandwidth gain and phase mismatch, offset mismatch, gain mismatch, and time-skew mismatch.

3. The method of claim 1, wherein the first calibration phase includes adjusting for at least one of component mismatch, analog front end bandwidth gain and phase mismatch, offset mismatch, gain mismatch, and time-skew mismatch in a priority order from a first calibration operation to a last calibration operation of 1) component mismatch, 2) analog front end bandwidth gain and phase mismatch, 3) offset mismatch, 4) gain mismatch, and 5) time-skew mismatch.

4. The method of claim 2, wherein adjusting for component mismatch involves calculating weights for a weight vector that includes one weight for each of the M subchannels, wherein the weight vector accounts for capacitor mismatch between the M subchannels.

5. The method of claim 1, wherein adjusting for time-skew mismatch involves capturing data from at least three subchannels at the TIADC sampling rate and determining timing offset in digital logic at a Y clock cycles, where Y is large relative to the TIADC sampling rate.

6. The method of claim 1, wherein the TIADC includes subchannel-level neural networks, and wherein the second calibration phase includes training each subchannel-level neural network individually.

7. The method of claim 6, wherein the TIADC includes M neural networks.

8. The method of claim 1, wherein the TIADC includes subchannel-level neural networks, and wherein the second calibration phase includes providing the ground truth to each one of the subchannel-level neural networks and training each one of the subchannel-level neural networks individually using the ground truth.

9. The method of claim 8, wherein the TIADC includes N sub-ADCs per subchannel and M×N neural networks.

10. The method of claim 1, wherein the TIADC includes sub-ADC-level neural networks, and wherein the second calibration phase includes providing the ground truth to each one of the sub-ADC-level neural networks and training each one of the sub-ADC-level neural networks individually using the ground truth.

11. The method of claim 10, wherein the TIADC includes N sub-ADCs per subchannel and M×N neural networks.

12. The method of claim 1, wherein the TIADC includes M neural networks.

13. The method of claim 1, wherein the TIADC includes N sub-ADCs per subchannel and M×N neural networks.

14. The method of claim 1, wherein the reference channel operates at a lower sampling frequency than the M subchannels.

15. A method for operating a time-interleaved analog to digital converter (TIADC), the method comprising:
   a first calibration phase that involves adjusting for at least one of offset error, gain error, and time skew of M subchannels of the TIADC, wherein the first calibration phase includes adjusting for at least one of component mismatch, analog front end bandwidth gain and phase mismatch, offset mismatch, gain mismatch, and time-skew mismatch; and
   a second calibration phase that is implemented after the first calibration phase and that involves training subchannel-specific neural networks to approximate a non-linear function of each of the M subchannels of the TIADC using an output from a reference channel as a ground truth.

16. The method of claim 15, further comprising outputting a digital signal from the TIADC in response to an analog signal after the first calibration phase and the second calibration phase.

17. A time-interleaved analog to digital converter (TIADC), comprising:
   M subchannels, each of the M subchannels including N sub-ADCs;
   a reference channel that includes an ADC; and
   subchannel-specific neural networks;
   wherein the subchannel-specific neural networks are coupled to the reference channel to receive outputs from the reference channel that are used as ground truths to train the subchannel-specific neural networks.

18. The TIADC of claim 17, wherein the TIADC includes M neural networks.

19. The TIADC of claim 17, wherein the TIADC includes N sub-ADCs per subchannel and M×N neural networks.

20. The TIADC of claim 17, wherein a capacitor of the reference channel is larger than capacitors of the M subchannels.

* * * * *